(12) United States Patent
Kim et al.

(10) Patent No.: US 11,984,434 B2
(45) Date of Patent: May 14, 2024

(54) LIGHT UNIT AND DISPLAY DEVICE INCLUDING THE SAME

(71) Applicant: Samsung Display Co., Ltd., Yongin-si (KR)

(72) Inventors: Duk-Sung Kim, Anyang-Si (KR); Junghyun Kwon, Hwaseong-Si (KR); Dong-Yoon Kim, Yongin-Si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 445 days.

(21) Appl. No.: 17/281,227

(22) PCT Filed: Apr. 5, 2019

(86) PCT No.: PCT/KR2019/004113
§ 371 (c)(1),
(2) Date: Mar. 29, 2021

(87) PCT Pub. No.: WO2020/075933
PCT Pub. Date: Apr. 16, 2020

(65) Prior Publication Data
US 2021/0391309 A1    Dec. 16, 2021

(30) Foreign Application Priority Data
Oct. 12, 2018   (KR) .......................... 10-2018-012949

(51) Int. Cl.
*H01L 25/075* (2006.01)
*H01L 27/12* (2006.01)
(Continued)

(52) U.S. Cl.
CPC ...... *H01L 25/0753* (2013.01); *H01L 27/1214* (2013.01); *H01L 33/504* (2013.01); *H01L 33/62* (2013.01)

(58) Field of Classification Search
CPC ............... H01L 25/0753; H01L 25/167; H01L 27/1214; H01L 27/156; H01L 33/36;
(Continued)

(56) References Cited

U.S. PATENT DOCUMENTS 8,816,955 B2   8/2014  Kang et al.
9,351,392 B2   5/2016  Lee et al.
(Continued)

FOREIGN PATENT DOCUMENTS

CN   108206234   6/2018
CN   108267891   7/2018
(Continued)

OTHER PUBLICATIONS

International Search Report dated Jul. 12, 2019, in Internationla Application No. PCT/KR2019/004113 (with English Translation).

*Primary Examiner* — Kyoung Lee
*Assistant Examiner* — Christina A Sylvia
(74) *Attorney, Agent, or Firm* — KILE PARK REED & HOUTTEMAN PLLC

(57) ABSTRACT

A display device includes a display panel and a light unit. The light unit includes a substrate, a circuit layer disposed on the substrate and including a line, an insulation layer covering the circuit layer, light emitting elements including a first electrode, a second electrode, and a light emitting layer, and a conductive layer electrically connected to one of the first electrode and the second electrode to cover at least a portion of the line.

20 Claims, 16 Drawing Sheets

(51) Int. Cl.
*H01L 33/50* (2010.01)
*H01L 33/62* (2010.01)

(58) Field of Classification Search
CPC ..... H01L 33/505; H01L 33/58; H01L 33/504; H01L 33/62
See application file for complete search history.

(56) References Cited

U.S. PATENT DOCUMENTS

| | | | |
|---|---|---|---|
| 9,447,957 B2 | 9/2016 | Choi et al. | |
| 10,330,977 B2 | 6/2019 | Lim et al. | |
| 10,720,558 B2 | 7/2020 | Moon et al. | |
| 10,816,849 B2 | 10/2020 | Lee et al. | |
| 2010/0103651 A1 | 4/2010 | Park | |
| 2014/0291666 A1 | 10/2014 | Tsang | |
| 2016/0170127 A1* | 6/2016 | Kim | G02B 6/0035 156/60 |
| 2017/0242300 A1* | 8/2017 | Lim | G02F 1/1334 |
| 2017/0352834 A1* | 12/2017 | Kim | G02F 1/133305 |
| 2018/0286843 A1 | 10/2018 | Jeong | |
| 2020/0013766 A1 | 1/2020 | Kim | |
| 2020/0126960 A1* | 4/2020 | Jeong | H01L 25/0753 |
| 2023/0122457 A1* | 4/2023 | Heo | H01L 24/95 257/91 |

FOREIGN PATENT DOCUMENTS

| | | |
|---|---|---|
| KR | 20080085399 | 9/2008 |
| KR | 100876221 | 12/2008 |
| KR | 20120045809 | 5/2012 |
| KR | 20130092893 | 8/2013 |
| KR | 20130110600 | 10/2013 |
| KR | 2016012019 A | 2/2016 |
| KR | 20170099450 | 9/2017 |
| KR | 20170099450 A | 9/2017 |
| KR | 101843505 | 3/2018 |
| KR | 20180079081 | 7/2018 |
| KR | 20200005692 | 1/2020 |

* cited by examiner

LIGHT UNIT AND DISPLAY DEVICE INCLUDING THE SAME

CROSS-REFERENCE TO RELATED APPLICATIONS

This application is a National Stage Entry of International Patent Application No. PCT/KR2019/004113, filed on Apr. 5, 2019, and claims priority from and the benefit of Korean Patent Application No. 10-2018-0121949, filed on Oct. 12, 2018, each of which is hereby incorporated by reference for all purposes if fully set forth herein.

BACKGROUND

Field

Embodiments of the invention relate generally to a light unit having improved heat dissipation characteristics and improved reflection characteristics and a display device including the same.

Discussion of the Background

A light receiving display device includes a display panel for displaying a screen and a backlight unit for providing light to the display panel. The backlight unit may include a light source. The backlight unit may be distinguished into a direct-type backlight unit or an edge-type backlight unit according to a position of the light source. The light source may have an advantage such as high color gamut reproducibility, high speed response, and lower power consumption, but be vulnerable to heat. Thus, a feature of dissipating heat generated from the light source may be one of important factors for preventing performance degradation of the light source.

The above information disclosed in this Background section is only for understanding of the background of the inventive concepts, and, therefore, it may contain information that does not constitute prior art.

SUMMARY

An object of the invention is to provide a light unit having improved heat dissipation characteristics and improved reflection characteristics and a display device including the same.

Additional features of the inventive concepts will be set forth in the description which follows, and in part will be apparent from the description, or may be learned by practice of the inventive concepts.

A display device according to an embodiment may include a display panel and a light unit configured to provide light to the display panel. The light unit may include: a substrate; a circuit layer disposed on the substrate and including a line and a transistor; an insulation layer disposed to cover the circuit layer; a light emitting element electrically connected to the line and the transistor and including a first electrode, a second electrode, and a light emitting layer; and a conductive layer disposed on the insulation layer and electrically connected to any one of the first electrode and the second electrode to cover at least a portion of the line and the transistor.

The first electrode may be electrically connected to the line, and the second electrode may be electrically connected to the transistor.

The conductive layer may be electrically connected to the first electrode and the line, and each of the conductive layer and the line may be configured to receive a power voltage.

The light emitting element may be provided in plurality, and the conductive layer may be electrically connected to the first electrode of each of the light emitting elements.

Each of the light emitting element and the conductive layer may be provided in plurality, and the conductive layers may be electrically connected to the light emitting elements, respectively, in a one-to-one corresponding manner.

The light emitting element may be provided in plurality, the light emitting elements may include a first light emitting element and a second light emitting element serially connected to the first light emitting element, and the conductive layer may be connected to the first electrode of the first light emitting element and the second electrode of the second light emitting element.

The light emitting element may further include a wavelength conversion layer disposed to cover the light emitting layer.

The light emitting layer may be configured to emit blue light, and the wavelength conversion layer may include a first wavelength conversion material and a second wavelength conversion material.

The light unit may further include a capping layer disposed to cover all of the wavelength conversion layer and the conductive layer.

The light unit may further include a capping layer disposed to cover the wavelength conversion layer.

The light unit may further include a thickness adjusting layer disposed between the insulation layer and the conductive layer, and the thickness adjusting layer may cover at least a portion of the line and the transistor.

The thickness adjusting layer may include an organic material.

The display device may further include a light guide plate disposed below the display panel, and the light unit may face a side surface of the light guide plate.

The display panel may include an active area configured to display an image, and the light unit may be disposed below the active area of the display panel.

The conductive layer may include aluminum.

The substrate may be a glass substrate.

A light unit according to an embodiment may include: a substrate; a circuit layer disposed on the substrate and including a line; an insulation layer configured to cover the circuit layer; light emitting elements including a first electrode, a second electrode, and a light emitting layer; and a conductive layer disposed on the insulation layer and electrically connected to any one of the first electrode and the second electrode to cover at least a portion of the line.

The first electrode may be electrically connected to the line, and the conductive layer may be connected to the first electrode of each of the light emitting elements.

A first light emitting element and a second light emitting element of the light emitting elements may be serially connected to each other, and the conductive layer may be electrically connected to the second electrode of the first light emitting element and the first electrode of the second light emitting element.

The conductive layer may be provided in plurality, and the conductive layers may be electrically connected to the light emitting elements, respectively, in a one-to-one corresponding manner.

The display device according to an embodiment includes the substrate, the circuit layer disposed on the substrate, the light emitting element connected to the circuit layer, and the conductive layer electrically connected to the light emitting element and covering at least a portion of the circuit layer. The conductive layer may be connected to the light emitting element and dissipate the heat generated from the light emitting element to the outside. Thus, the deterioration phenomenon of the light emitting element by the heat may be prevented, and, as a result, the reliability of the light emitting element may be improved. Also, since the conductive layer covers at least a portion of the circuit layer, the conductive layer may reflect the light incident to the conductive layer and change the light path toward the display panel. Thus, the light efficiency of the light unit may be improved. Also, the conductive layer serves as the reflective film, the reflective film may be omitted.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
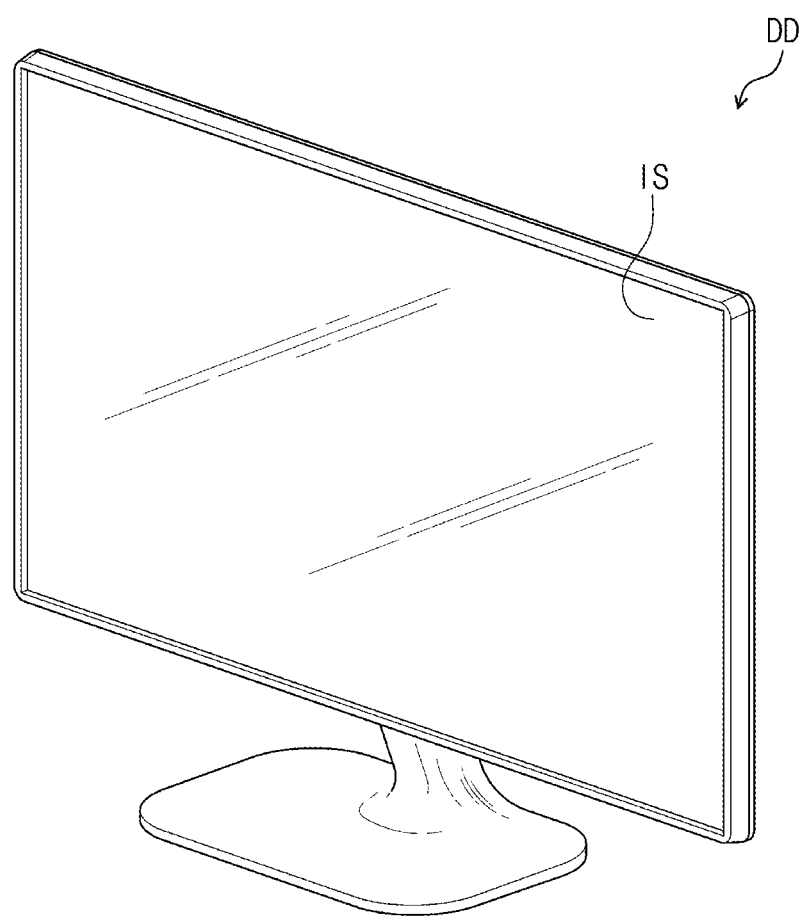
FIG. 1 is a perspective view of a display device according to an embodiment.
Figure 1:
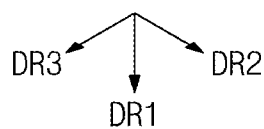

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a display device DD according to an embodiment.

Referring to FIG. 1, the display device DD may display an image through a display area IS. In FIG. 1, the display area IS is exemplarily illustrated to be disposed on a surface defined by a first direction DR1 and a second direction DR2 crossing the first direction DR1. However, in another embodiment, the display area of the display device may be disposed on a curved surface.

A thickness direction of the display device DD indicates a third direction DR3. Directions indicated by the first, second, and third directions DR1, DR2, and DR3, as relative concepts, may be converted with respect to each other. In this specification, an expression "when viewed on a plane" may represent a case when viewed in the third direction DR3. Also, the "thickness direction" may represent the third direction DR3.

In FIG. 1, the display device DD is exemplarily illustrated as a television. However, the display device DD may be used for large-sized electronic devices such as monitors or outdoor advertisement boards and small and medium-sized electronic devices such as personal computers, notebook computers, personal digital terminals, navigation units for vehicles, game consoles, smartphones, tablet computers, and cameras. Also, the above devices are merely described as embodiments, and thus the display device may be adopted to other electronic devices unless departing from the concept of the invention.

Figure 2:
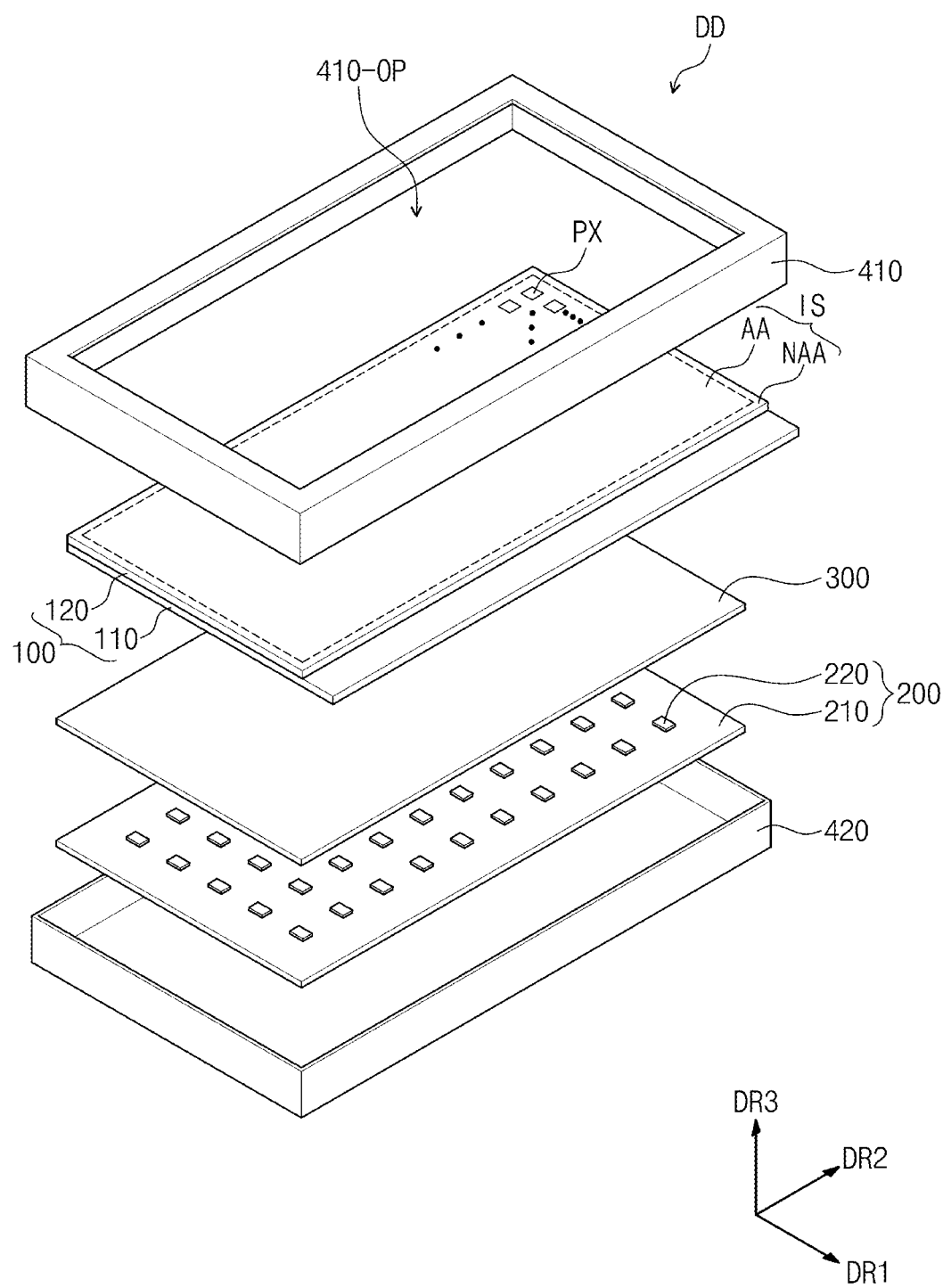
FIG. 2 is an exploded perspective view of the display device according to an embodiment.
Figure 3:
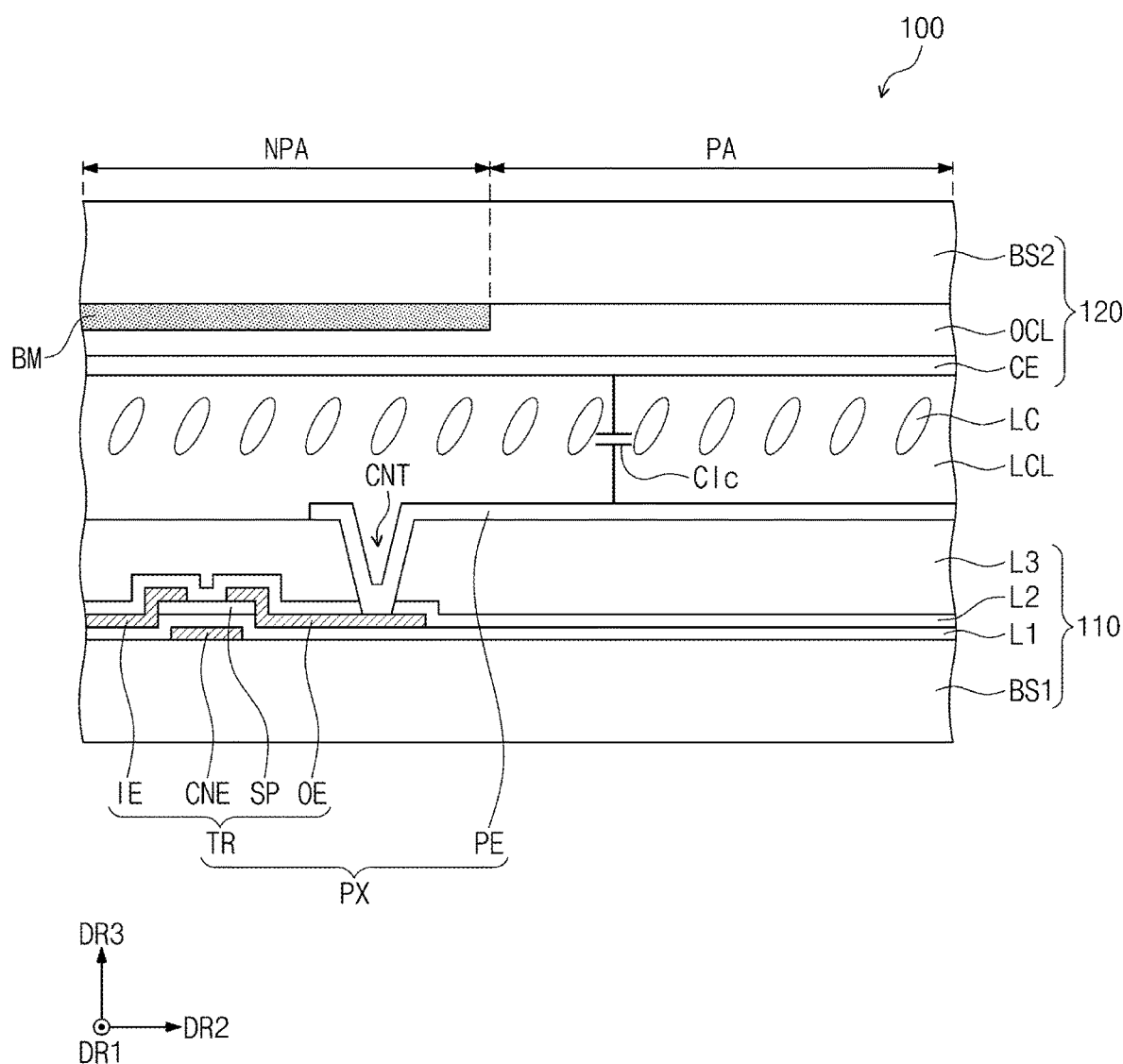
FIG. 3 is a cross-sectional view illustrating a portion of the display device.

FIG. 2 is an exploded perspective view illustrating the display device DD according to an embodiment. FIG. 3 is a cross-sectional view illustrating a portion of the display device.

Referring to FIGS. 2 and 3, the display device DD may include a display panel 100, a light unit 200, an optical film 300, an upper protection member 410, and a lower protection member 420.

The display panel 100 may be configured to receive an electrical signal to display an image. A user may receive information through an image provided by the display panel 100. The display panel 100 includes a display area IS parallel to a plane defined by the first direction DR1 and the second direction DR2. The display area IS may be distinguished into an active area AA and a peripheral area NAA. The display panel 100 displays an image on the active area AA in the third direction DR3. The active area AA may be activated by an electric signal. The display panel 100 includes a plurality of pixels PX disposed on the active area AA.

The peripheral area NAA is disposed adjacent to the active area AA. In an embodiment, the peripheral area NAA may surround the active area AA. In the peripheral area NAA, all sorts of driving circuits providing an electrical signal to the pixels PX or pads for receiving electrical signals from the outside may be disposed.

FIG. 3 is a cross-sectional view exemplarily illustrating a region in which one pixel PX (hereinafter, referred to as a pixel) of the display panel 100 is disposed. Hereinafter, the display panel 100 will be described with reference to FIG. 3.

The display panel 100 may include a first substrate 110, a second substrate 120, and a liquid crystal layer LCL.

The first substrate 110 may include a first base substrate BS1, a pixel transistor TR, a pixel electrode PE, and a plurality of insulation layers L1, L2, and L3.

The second substrate 120 may include a second base substrate BS2, a common electrode CE, a planarization layer OCL, and a light shielding layer BM.

Each of the first base substrate BS1 and the second base substrate BS2 may include an insulating material. For example, each of the first base substrate BS1 and the second base substrate BS2 may be a silicon substrate, a plastic substrate, an insulation film, a laminated structure, or a glass substrate. The laminated structure may include a plurality of insulation layers.

The pixel PX may include a pixel transistor TR and a pixel electrode PE. The pixel transistor TR may include a control electrode CNE, an input electrode IE, an output electrode OE, and a semiconductor pattern SP.

The control electrode CNE may be disposed on the first base substrate BS1. The control electrode CNE may include a conductive material. For example, the conductive material may be a metal material, e.g., molybdenum, silver, titanium, copper, aluminum, or an alloy thereof.

A first insulation layer L1 may be disposed on the first base substrate BS1 to cover the control electrode CNE. For example, the control electrode CNE may be disposed between the first insulation layer L1 and the first base substrate BS1.

The semiconductor pattern SP may be disposed on the first insulation layer L1. On a cross-section, the semiconductor pattern SP may be spaced apart from the control electrode CNE with the first insulation layer L1 therebetween.

The semiconductor pattern SP may include a semiconductor material. For example, the semiconductor material may include at least one of amorphous silicon, polycrystalline silicon, monocrystalline silicon, oxide semiconductor, and compound semiconductor. Also, the pixel PX may include a plurality of transistors, and each of the transistors may include the same semiconductor material or a different semiconductor material. However, embodiments are not limited thereto.

Also, the input electrode IE and the output electrode OE may be disposed on the semiconductor pattern SP.

A second insulation layer L2 may be disposed on the first insulation layer L1 to cover the semiconductor pattern SP, the input electrode IE, and the output electrode OE. For example, the semiconductor pattern SP, the input electrode IE, and the output electrode OE may be disposed between the first insulation layer L1 and the second insulation layer L2.

A third insulation layer L3 may be disposed on the second insulation layer L2. The third insulation layer L3 may be a color filter. For example, when the third insulation layer L3 is a red color filter, the third insulation layer L3 may transmit light in a red wavelength region and block light in a different wavelength region.

Although the third insulation layer L3 is exemplarily described as a color filter in FIG. 3, embodiments are not limited thereto. For example, in another embodiment, the third insulation layer L3 may be a transparent insulation layer providing a flat surface, and the color filter may be disposed on the second base substrate BS2. Also, in another embodiment, the color filter may be replaced by a wavelength conversion layer. The wavelength conversion layer may include a quantum dot and/or a quantum rod.

Also, for example, a capping layer covering the third insulation layer L3 may be further provided. The capping layer may include an inorganic material, e.g., silicon nitride or silicon oxide. The capping layer may serve to protect the third insulation layer L3 by covering the third insulation layer L3. Also, an opening, through which a gas generated from the third insulation layer L3 is discharged, may be defined in the capping layer.

The pixel electrode PE may be electrically connected to the pixel transistor TR. A contact hole CNT is defined in each of the second insulation layer L2 and the third insulation layer L3. The contact hole CNT may be provided by removing a portion of each of the second insulation layer L2 and the third insulation layer L3. The contact hole CNT may expose a component disposed below the second insulation layer L2 and the third insulation layer L3. For example, the contact hole CNT may expose the output electrode OE. The pixel electrode PE may be electrically connected to the output electrode OE exposed by the contact hole CNT. The pixel electrode PE may be electrically connected to the output electrode OE by directly contacting the output electrode OE. Alternatively, the pixel electrode PE may be electrically connected to the output electrode OE by indirectly contacting the output electrode OE through a conductive member disposed between the pixel electrode PE and the output electrode OE.

The liquid crystal layer LCL may be disposed on the pixel electrode PE. The liquid crystal layer LCL may include a plurality of liquid crystal molecules LC. Orientations of the liquid crystal molecules LC may be changed according to an electric field provided between the common electrode CE and the pixel electrode PE. The pixel electrode PE constitutes a liquid crystal capacitor Clc in conjunction with the common electrode CE and the liquid crystal layer LCL. The liquid crystal capacitor Clc may control an orientation of the liquid crystal layer LCL by the electric field provided between the common electrode CE and the pixel electrode PE to control a transmittance of the liquid crystal layer LCL. The pixel PX displays light corresponding to the transmittance of the liquid crystal layer LCL.

The second base substrate BS2 may be disposed on the liquid crystal layer LCL. The light shielding layer BM may be disposed on one surface of the second base substrate BS2, which faces the first base substrate BS1. The light shielding layer BM may overlap the pixel transistor TR in a plan view.

An area covered by the light shielding layer BM may be defined as a light shielding area NPA, and an area that is not covered by the light shielding layer BM may be defined as a light emitting area PA. Light transmitted through the liquid crystal layer LCL may be discharged or emitted to the outside of the second base substrate BS2 through the light emitting area PA.

The planarization layer OCL covering the light shielding layer BM may be disposed on the one surface of the second base substrate BS2, which faces the first base substrate BS1. The planarization layer OCL may include an organic material. In the display panel 100 according to another embodiment, the planarization layer OCL may be omitted.

The common electrode CE may be disposed on the planarization layer OCL. The common electrode CE provides an electric field with the pixel electrode PE. In an embodiment, the common electrode CE may be disposed on a rear surface of the second base substrate BS2 to have an integrated shape overlapping the plurality of pixels. However, this is merely illustrative. The common electrode CE may be provided as a plurality of patterns, and the patterns may be provided on the pixel areas, respectively. Alternatively, the common electrode CE may be disposed on the first base substrate BS1 to constitute the first substrate 110.

Also, although the pixel electrode PE has a shape in which a slit or the like is not disposed in FIG. 3, in the display panel 100 according to an embodiment, at least one of the common electrode CE and the pixel electrode PE may have a shape including a plurality of slits.

Referring to FIG. 2 again, the light unit 200 may be disposed below the display panel 100. For example, the light unit 200 may be disposed below the active area AA of the display panel 100. The light unit 200 may face the display panel 100 and provide light to the display panel 100.

The display panel 100 generates an image by controlling a transmittance of each of the pixels PX based on the provided light. In an embodiment, the display panel 100 may be a light transmissive display panel.

The light unit 200 may include a circuit board 210 and light emitting elements 220. The circuit board 210 may be disposed below the display panel 100. The circuit board 210 may have a plate shape facing the display panel 100. For example, the circuit board 210 may include a base substrate and circuit lines mounted on the base substrate. The circuit lines may receive an electrical signal from the outside to transmit the received electrical signal to the light emitting elements 220. For example, the circuit lines may electrically connect the light emitting elements 220.

Each of the light emitting elements 220 generates light. The light emitting elements 220 may be disposed on the circuit board 210 and electrically connected to the circuit board 210. The light emitting elements 220 may be spaced apart from each other. In an embodiment, the light emitting elements 220 may be arranged in parallel along the first direction DR1 and the second direction DR2.

The light emitting elements 220 may be disposed between the circuit board 210 and the display panel 100 and provide light to the display panel 100. In an embodiment, the light unit 200 may be referred to as a direct-type light unit.

The optical film 300 may be disposed between the display panel 100 and the light unit 200. The optical film 300 may improve an efficiency of the light supplied from the light unit 200 to the display panel 100 and/or light uniformity so that the light is supplied uniformly to the entire display panel 100. The optical film 300 may include a single sheet or a plurality of sheets. For example, the optical film 300 may include at least any one of a lenticular sheet, a prism sheet, or a scattering sheet. In the display device DD according to another embodiment, the optical film 300 may be omitted.

The upper protection member 410 may be disposed on the display panel 100 to cover the display panel 100. The upper protection member 410 may include a predetermined opening 410-OP for exposing at least a portion of the display panel 100. The opening 410-OP may expose the active area AA of the display panel 100. The image displayed on the active area AA may be viewed from the outside through the opening 410-OP. Also, the display device DD according to an embodiment may further include a transparent protection member disposed at the opening 410-OP. Alternatively, the upper protection member 410 according to another embodiment may be optically clear. Here, the opening 410-OP may be omitted. Alternatively, the display device DD according to another embodiment may not include the upper protection member 410.

The lower protection member 420 may be coupled with the upper protection member 410 to protect the display panel 100 and the light unit 200. The lower protection member 420 may include a bottom part and a sidewall part. The bottom part may have an area that is equal to or greater than that of the display panel 100. The display panel 100 and the light unit 200 may be accommodated in an inner space defined by the upper protection member 410 and the lower protection member 420 and protected from an external impact.

Figure 4:
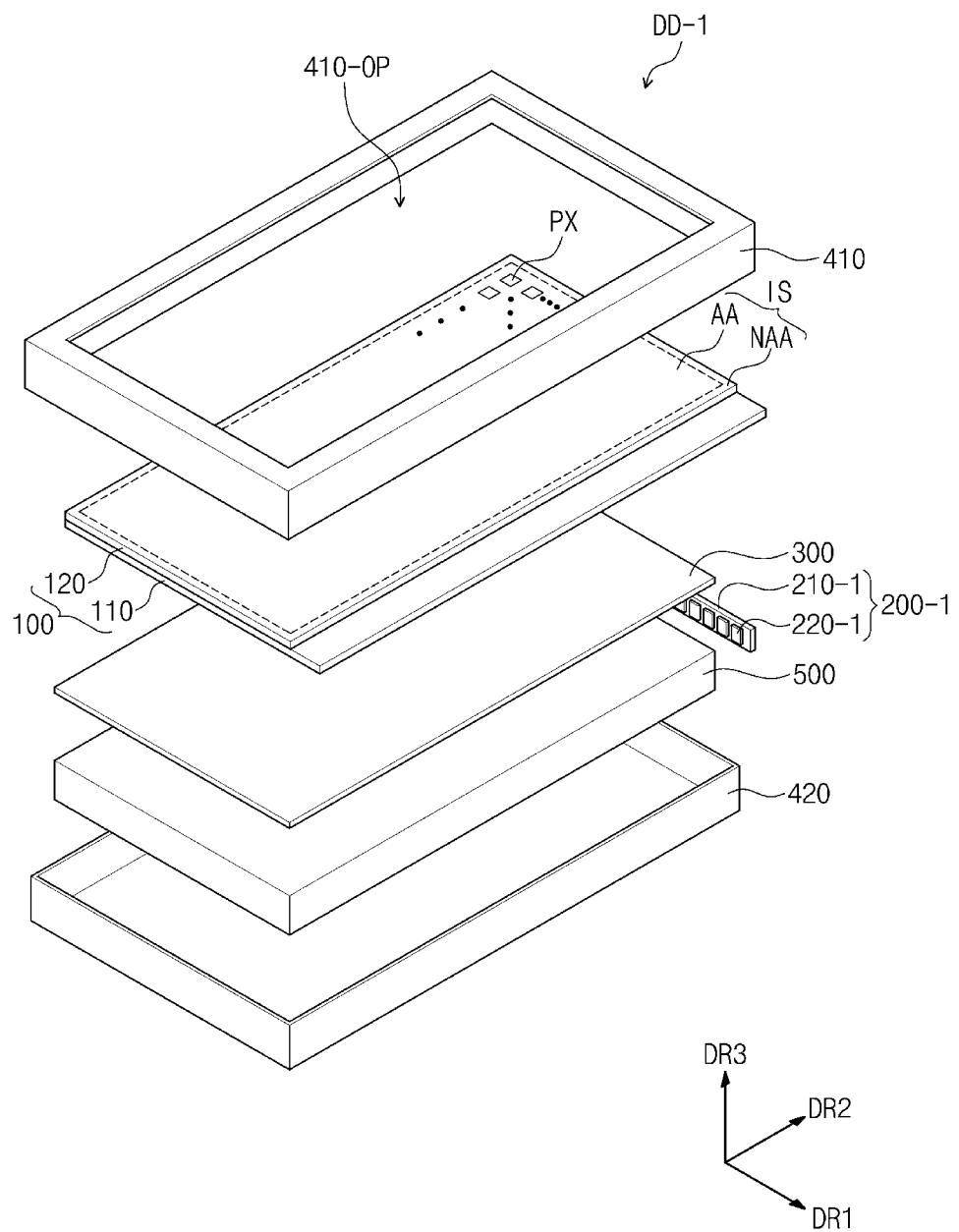
FIG. 4 is an exploded perspective view of a display device according to an embodiment.

FIG. 4 is an exploded perspective view illustrating a display device DD-1 according to an embodiment. In describing FIG. 4, the same component as that described in FIG. 2 will be designated by the same reference numeral, and a description thereof will be omitted.

Referring to FIG. 4, the display device DD-1 may include a display panel 100, a light unit 200-1, an optical film 300, an upper protection member 410, a lower protection member 420, and a light guide plate 500.

The light guide plate 500 may have a plate shape parallel to the display panel 100. The light guide plate 500 may have a top surface facing the display panel 100. The light guide plate 500 receives light from the light unit 200-1 and provides the received light to the display panel 100. The light guide plate 500 may control a path of light emitted from the light unit 200-1 to be provided to an entire surface of the display panel 100.

The light unit 200-1 may face a side surface of the light guide plate 500. The light unit 200-1 may provide light to the side surface of the light guide plate 500.

The light unit 200-1 includes a circuit board 210-1 and a plurality of light emitting elements 220-1. The circuit board 210-1 may have a plate shape having a length extending in the first direction DR1 and a width extending in the third direction DR3.

Each of the light emitting elements 220-1 generates light. The light emitting elements 220-1 may be disposed on the circuit board 210-1 and electrically connected to the circuit board 210-1. The light emitting elements 220-1 may be spaced apart from each other in a longitudinal direction of the circuit board 210-1. In an embodiment, the light emitting elements 220-1 are arranged in a row along the first direction DR1.

Figure 5:
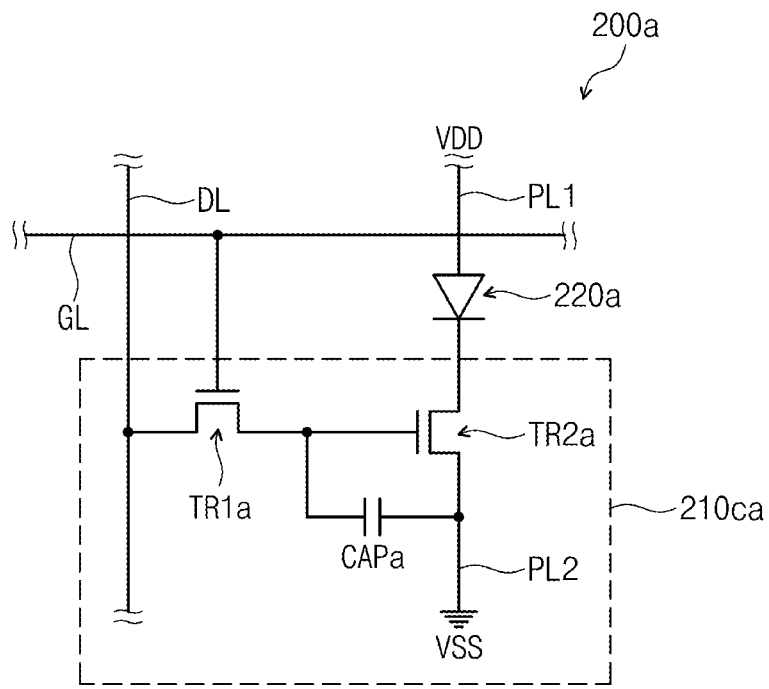
FIG. 5 is an equivalent circuit diagram of a light unit according to an embodiment.

FIG. 5 is an equivalent circuit diagram of a light unit 200a according to an embodiment. FIG. 5 is an equivalent circuit diagram illustrating one light emitting element 220a of the light emitting elements 220 in FIG. 2 and a circuit connected to the light emitting element 220a. Also, one light emitting element of the light emitting elements 220-1 in FIG. 4 and a circuit connected thereto may have the same equivalent circuit.

Referring to FIG. 5, the light unit 200a may include a light emitting element 220a and a light emitting element circuit 210ca.

The light emitting element 220a may be electrically connected to a plurality of signal lines. In an embodiment, a gate line GL, a data line DL, a first power line PL1, and a second power line PL2 are exemplarily illustrated among the signal lines. However, this is merely an example, and embodiments are not limited thereto. For example, the light unit 200a according to an embodiment may be additionally connected to various signal lines.

The light emitting element circuit 210ca may include a first transistor TR1a, a capacitor CAPa, and a second transistor TR2a. Each of the first transistor TR1a and the second transistor TR2a may be an n-type transistor.

The first transistor TR1a may transmit or block a data signal transmitted through the data line DL in response to a gate signal transmitted through the gate line GL.

The capacitor CAPa is connected to the first transistor TR1a and the second transistor TR2a. The capacitor CAPa charges the amount of charge corresponding to the difference between a data signal transmitted from the first transistor TR1a and a second power voltage VSS applied to the second power line PL2.

The second transistor TR2a is connected to the first transistor TR1a, the capacitor CAPa, and the light emitting element 220a. The second transistor TR2a controls a driving current flowing through the light emitting element 220a in correspondence with the amount of charge stored in the capacitor CAPa. A turn-on time of the second transistor TR2a may be determined according to the amount of charge charged in the capacitor CAPa. The second transistor TR2a provide the second power voltage VSS, which is transmitted through the second power line PL2 during the turn-on time, to the light emitting element 220a during the turn-on time.

The light emitting element 220a is connected to the second transistor TR2a and the first power line PL1. The light emitting element 220a may include an anode electrode connected to the first power line PL1 and a cathode electrode connected to the second transistor TR2a. The light emitting element 220a may emit light according to a voltage corresponding to the difference between a signal transmitted through the second transistor TR2a and the first power voltage VDD received through the first power line PL1.

Figure 6:
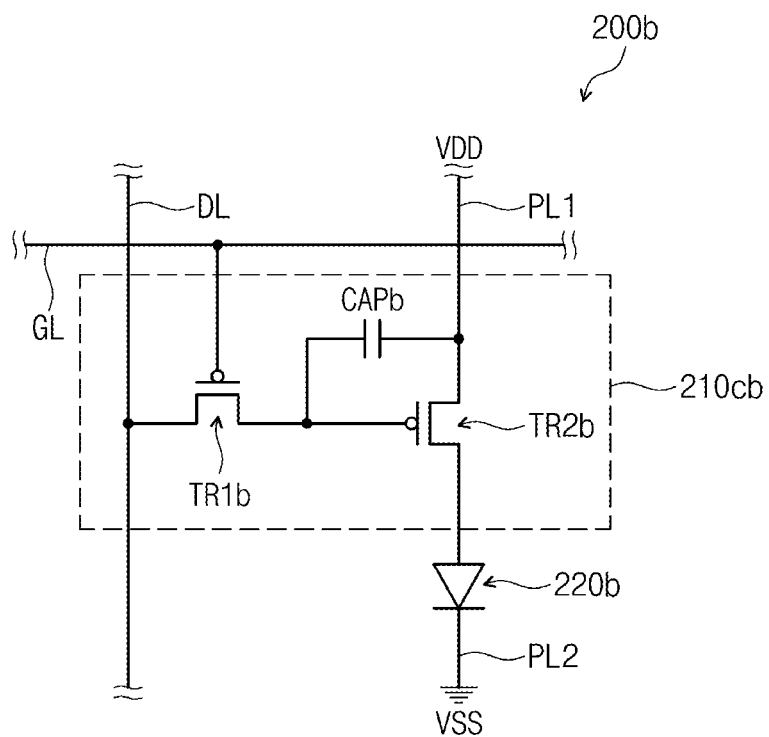
FIG. 6 is an equivalent circuit diagram of a light unit according to an embodiment.

FIG. 6 is an equivalent circuit diagram of a light unit 200b according to an embodiment. In FIG. 6, the same component as that described in FIG. 5 will be designated by the same reference numeral, and a description thereof will be omitted for descriptive convenience.

Referring to FIG. 6, the light unit 200b may include a light emitting element 220b and a light emitting element circuit 210cb.

The light emitting element circuit 210cb may include a first transistor TR1b, a capacitor CAPb, and a second transistor TR2b. Each of the first transistor TR1b and the second transistor TR2b may be a p-type transistor.

The first transistor TR1b may transmit or block a data signal transmitted through the data line DL in response to a gate signal transmitted through the gate line GL. The capacitor CAPb is connected to the first transistor TR1b and the first power line PL1. The capacitor CAPb charges the amount of charge corresponding to the difference between a data signal transmitted from the first transistor TR1b and the first power voltage VDD applied to the first power line PL1.

The second transistor TR2b is connected to the first transistor TR1b, the capacitor CAPb, and the light emitting element 220b. The second transistor TR2b controls a driving current flowing through the light emitting element 220b in correspondence with the amount of charge stored in the capacitor CAPb. The second transistor TR2b provide the first power voltage VDD, which is transmitted through the first power line PL1, to the light emitting element 220b during a turn-on time.

The light emitting element 220b is connected to the second transistor TR2b and the second power line PL2. The light emitting element 220b may include an anode electrode connected to the second transistor TR2b and a cathode electrode connected to the second power line PL2. The light emitting element 220b may emit light with a voltage corresponding to the difference between a signal transmitted through the second transistor TR2b and a second power voltage VSS received through the second power line PL2.

Figure 7A:
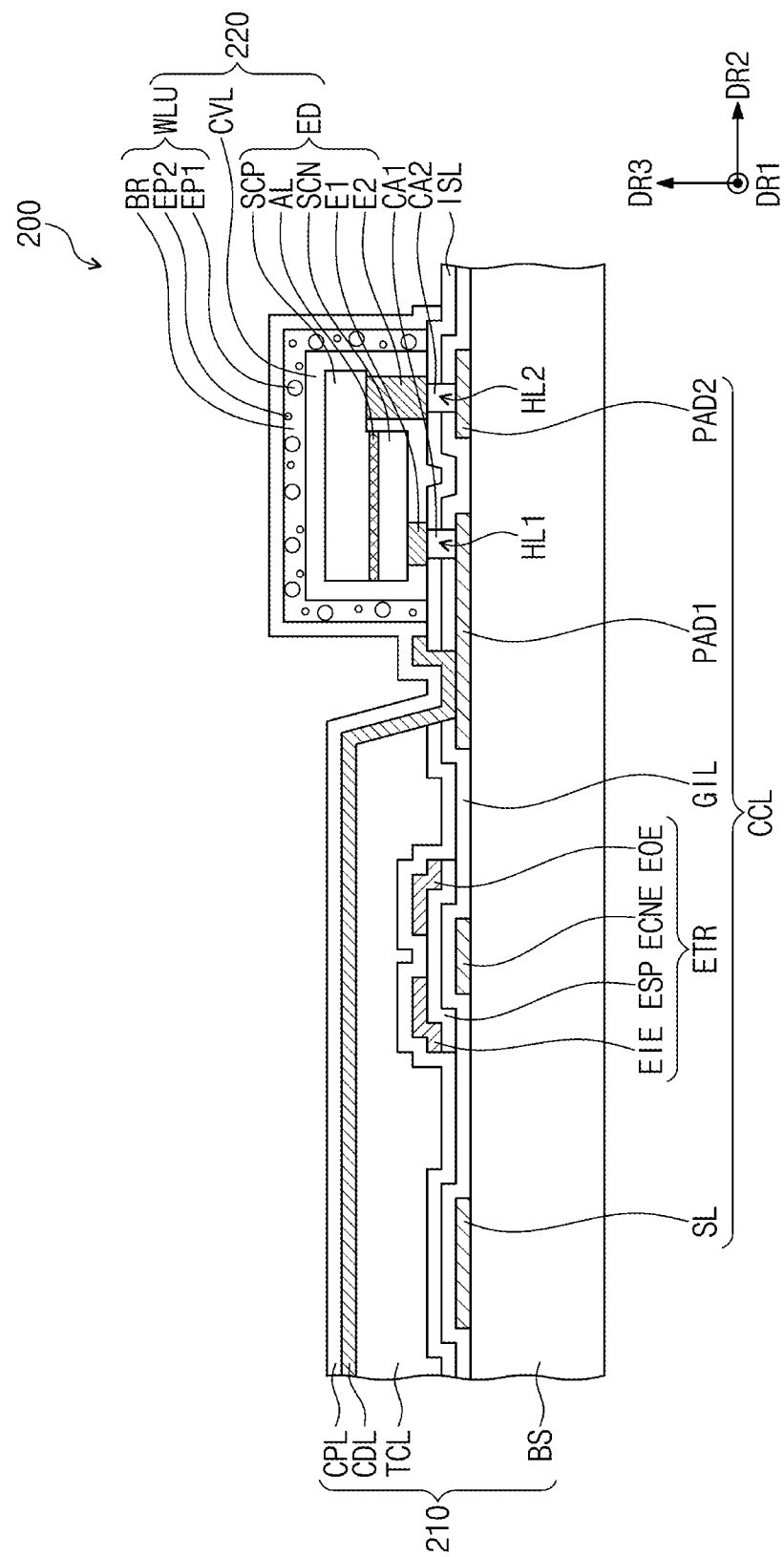
FIG. 7A is a cross-sectional view illustrating a portion of a light unit according to an embodiment.

FIG. 7A is a cross-sectional view illustrating a portion of the light unit according to an embodiment. Specifically, FIG. 7A is a cross-sectional view exemplarily illustrating a region in which one light emitting element 220 (hereinafter, referred to as a light emitting element) of the light emitting elements 220 is disposed.

Referring to FIG. 7A, the light unit 200 may include a circuit board 210 and a light emitting element 220.

The circuit board 210 may include a base substrate BS, a circuit layer CCL, an insulation layer ISL, a thickness adjusting layer TCL, a conductive layer CDL, and a capping layer CPL.

The base substrate BS may contain an insulating material. For example, the base substrate BS may be a silicon substrate, a plastic substrate, an insulation film, a laminated structure, or a glass substrate. The laminated structure may include a plurality of insulation layers.

The circuit layer CCL may be disposed on the base substrate BS. The circuit layer CCL may include a line SL, a transistor ETR, an insulation layer GIL, a first pad PAD1, and a second pad PAD2.

The transistor ETR may be one of the first transistor TR1a, the second transistor TR2a, the first transistor TR1b, and the second transistor TR2b, which are previously described in FIGS. 5 and 6. The line SL may be a connection line for connecting the light emitting element 220 to the adjacent light emitting element or a power line for supplying a power to the light emitting element 220. The power line may be one of the first power line PL1 or the second power line PL2, which are described in FIGS. 5 and 6.

The transistor ETR may include a control electrode ECNE, an input electrode EIE, an output electrode EOE, and a semiconductor pattern ESP.

The control electrode ECNE and the line SL may be disposed on the base substrate BS. The control electrode ECNE and the line SL may be disposed on the base substrate BS to cover the base substrate BS. The semiconductor pattern ESP may be disposed on the insulation layer GIL. The input electrode EIE and the output electrode EOE may be disposed on the semiconductor pattern ESP.

Although the line SL is exemplarily disposed on the same layer as the control electrode ECNE in FIG. 7A, embodiments are not limited thereto. For example, in an embodiment, the line SL may be disposed on the same layer as the input electrode EIE and the output electrode EOE. Also, in an embodiment, the line SL may have a double layer structure, and the line SL may include a first line layer disposed on the same layer as the control electrode ECNE and a second line layer disposed on the same layer as the input electrode EIE and the output electrode EOE.

The first pad PAD1 and the second pad PAD2 may be disposed on the base substrate BS. The first pad PAD1 and the second pad PAD2 may be disposed on the same layer as the control electrode ECNE. However, embodiments are not limited thereto. For example, in an embodiment, the first pad PAD1 and the second pad PAD2 may be disposed on the same layer as the input electrode EIE and the output electrode EOE. Also, in an embodiment, each of the first pad PAD1 and the second pad PAD2 have a double layer structure, and each of the first pad PAD1 and the second pad PAD2 may include a first pad layer disposed on the same layer as the control electrode ECNE and a second pad layer disposed on the same layer as the input electrode EIE and the output electrode EOE.

In another embodiment, the circuit layer CCL may not include the transistor ETR. For example, the circuit layer CCL may include only the line SL, the first pad PAD1, and the second pad PAD2.

The insulation layer ISL may be disposed on the circuit layer CCL. The insulation layer ISL may cover the circuit layer CCL.

The light emitting element 220 may be disposed on the insulation layer ISL. Through-holes HL1 and HL2 may be defined in the insulation layers ISL and GIL. A first through-hole HL1 may be provided on the first pad PAD1, and a second through-hole HL2 may be provided on the second pad PAD2.

A first conductive adhesive layer CA1 may be disposed in the first through-hole H L1, and a second conductive adhesive layer CA2 may be disposed in the second through-hole H L2. The light emitting element 220 may be electrically connected to the first pad PAD1 and the second pad PAD2 through the first conductive adhesive layer CA1 and the second conductive adhesive layer CA2.

The light emitting element 220 may include a light emitting element ED, a cover layer CVL, and a wavelength conversion layer WLU.

The light emitting element ED may include a first electrode E1, a second electrode E2, and a light emitting layer including an n-type semiconductor layer SCN, a p-type semiconductor layer SCP, and an active layer AL.

The n-type semiconductor layer SCN may be provided by doping an n-type dopant in a semiconductor layer, and the p-type semiconductor layer SCP may be provided by doping a p-type dopant in a semiconductor layer. The semiconductor layer may include a semiconductor material, e.g., GaN, AlN, AlGaN, InGaN, InN, InAlGaN, or AlInN. However, embodiments are not limited thereto. The n-type dopant may include silicon (Si), germanium (Ge), tin (Sn), selenium (Se), tellurium (Te), or a combination thereof. However, embodiments are not limited thereto. The p-type dopant may include magnesium (Mg), zinc (Zn), calcium (Ca), strontium (Sr), barium (Ba), or a combination thereof. However, embodiments are not limited thereto.

The active layer AL may be disposed between the n-type semiconductor layer SCN and the p-type semiconductor layer SCP. The active layer AL may have at least one of a single-quantum well structure, a multi-quantum well structure, a quantum line structure, or a quantum dot structure. The active layer AL may be an area in which an electron injected through the n-type semiconductor layer SCN and a hole injected through the p-type semiconductor layer SCP are re-coupled to each other. The active layer AL may be a layer emitting light having energy that is determined by an own energy band of a material. The active layer AL may be disposed at various positions that are changed according to kinds of diodes.

The n-type semiconductor layer SCN may contact the first electrode E1, and the p-type semiconductor layer SCP may contact the second electrode E2. The first electrode E1 may be connected to the first pad PAD1 through the first conductive adhesive layer CA1, and the second electrode E2 may be connected to the second pad PAD2 through the second conductive adhesive layer CA2. In another embodiment, the first conductive adhesive layer CA1 and the second conductive adhesive layer CA2 may be omitted. In this case, the first electrode E1 may directly contact the first pad PAD1, and the second electrode E2 may directly contact the second pad PAD2. For example, the first electrode E1 may be a cathode electrode, and the second electrode E2 may be an anode electrode.

When the light emitting element 220 is connected to the light emitting element circuit 210ca in FIG. 5, the first pad PAD1 may extend from the second transistor TR2a, and the second pad PAD2 may extend from the first power line PL1. Thus, the first electrode E1 may be electrically connected to the second transistor TR2a, and the second electrode E2 may be electrically connected to the first power line PL1. The second electrode E2 may receive the first power voltage VDD.

When the light emitting element 220 is connected to the light emitting element circuit 210cb in FIG. 6, the first pad PAD1 may extend from the second power line PL2, and the second pad PAD2 may extend from the second transistor TR2b. Thus, the first electrode E1 may be electrically connected to the second power line PL2, and the second electrode E2 may be electrically connected to the second transistor TR2b. The first electrode E1 may receive the second power voltage VSS.

The cover layer CVL may cover the light emitting element ED. The cover layer CVL may be an inorganic insulation layer or an organic insulation layer. In another embodiment, the cover layer CVL may be omitted.

The wavelength conversion layer WLU may be disposed on the cover layer CVL. The wavelength conversion layer WLU may convert a wavelength of light emitted from the light emitting element ED. The wavelength conversion layer WLU may include a base resin BR, a first light emitter EP1, and a second light emitter EP2.

The base resin BR may be a polymer resin. For example, the base resin BR may include an acryl-based resin, a urethane-based resin, a silicon-based resin, and an epoxy-based resin. The base resin BR may be a transparent resin.

Each of the first light emitter EP1 and the second light emitter EP2 may include a material that receives predetermined light to convert and emit the received light. For example, each of the first light emitter EP1 and the second light emitter EP2 may be a quantum dot.

The quantum dot may have a shape including a pyramid shape, a multi-arm shape, or a cubic shape of nano-particles, nano-tubes, nano-wires, nano-fibers, or nano-plate-shaped particles. However, embodiments are not limited to the shape of the quantum dot.

The light emitted from the quantum dot may have a color that is changed according to a particle size. Thus, a particle size of the first light emitter EP1 and a particle size of the second light emitter EP2 may be different from each other. For example, the first light emitter EP1 may have a particle size greater than that of the second light emitter EP2. In this case, the first light emitter EP1 may emit light having a longer wavelength than that of the second light emitter EP2.

For example, the light emitting element ED may emit blue light. The first light emitter EP1 may emit red light by absorbing the blue light. The second light emitter EP2 may emit green light by absorbing the blue light. Light transmitted through the wavelength conversion layer WLU and provided to the display panel 100 (refer to FIG. 2) may be white light in which the red light, the blue light, and the green light are mixed.

The thickness adjusting layer TCL may be disposed on the insulation layer ISL. For example, the thickness adjusting layer TCL may be disposed on the line SL and the transistor ETR. The thickness adjusting layer TCL may include an organic material. However, embodiments are not limited thereto. For example, the thickness adjusting layer TCL may include a plurality of inorganic layers or have a structure in which an organic layer and an inorganic layer are alternately laminated.

The conductive layer CDL may be disposed on the thickness adjusting layer TCL. Thus, the thickness adjusting layer TCL may be disposed between the conductive layer CDL and the circuit layer CCL. The conductive layer CDL may be spaced from the circuit layer CCL by a predetermined distance according to the thickness adjusting layer TCL. Thus, a parasitic capacitance may be prevented from being generated between the conductive layer CDL and the circuit layer CCL.

The conductive layer CDL may include a conductive material. Also, the conductive layer CDL may include a material having a high thermal conductivity. The conductive layer CDL may include a metal material or an alloy thereof. For example, the conductive layer CDL may include at least one of aluminum, silver, titanium, copper, tungsten, gold, platinum, magnesium, graphene, graphite, and a carbon nanotube. However, this is merely an example, and the material of the conductive layer CDL is not limited to the above examples.

The conductive layer CDL may include a single layer or a plurality of laminated layers. The plurality of laminated layers may include the same materials as each other or different materials from each other.

The conductive layer CDL may be electrically connected to the light emitting element 220. For example, the conductive layer CDL may be electrically connected to any one of the first electrode E1 and the second electrode E2. In FIG. 7A, the conductive layer CDL directly contacts the first pad PAD1 electrically connected to the first electrode E1 as an example. Heat generated in the light emitting element 220 may be dissipated to the outside through the first pad PAD1 and the conductive layer CDL. Thus, a deterioration phenomenon of the light emitting element 220 by the heat may be prevented, and reliability of the light emitting element 220 may be improved.

Also, the conductive layer CDL may cover an area adjacent to the light emitting element 220. For example, the conductive layer CDL may cover the line SL and the transistor ETR. Light transmitted toward the conductive layer CDL may be reflected by the conductive layer CDL and transmitted toward the display panel 100 (refer to FIG. 2). Thus, a light efficiency of the light unit 200 may be improved. Also, since the conductive layer CDL serves as a reflective film, the reflective film may be omitted.

The capping layer CPL may be disposed on the conductive layer CDL and the light emitting element 220. The capping layer CPL may be provided to protect the wavelength conversion layer WLU and the conductive layer CDL from moisture or air. Since the capping layer CPL is applied on an entire surface, a process of additionally patterning the capping layer CPL may be omitted. Also, the capping layer CPL may protect the conductive layer CDL from moisture or air in addition to the wavelength conversion layer WLU.

The capping layer CPL may include an inorganic material. Although the inorganic material may include, e.g., silicon nitride, silicon oxynitride, silicon oxide, titanium oxide, or aluminum oxide, embodiments are not limited thereto.

Figure 7B:
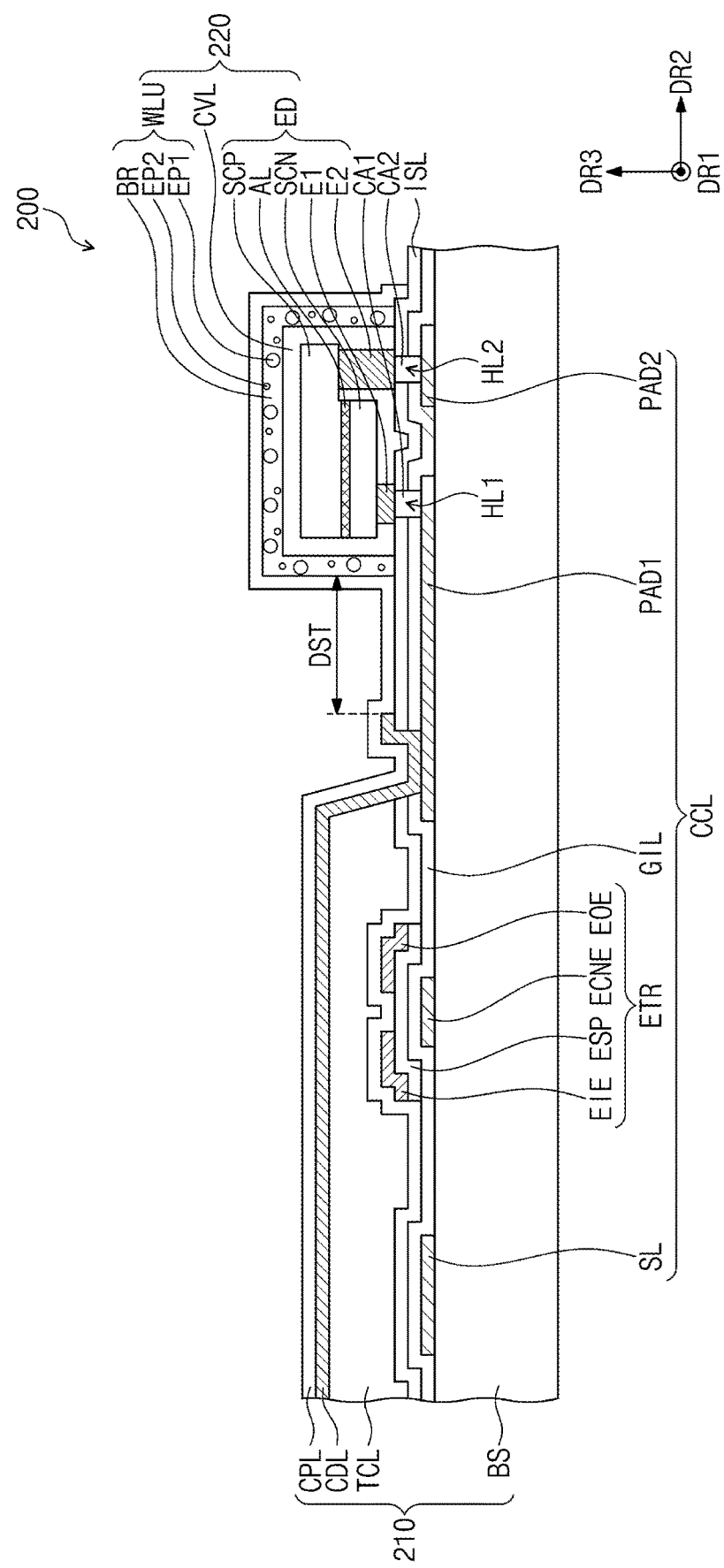
FIG. 7B is a cross-sectional view illustrating a portion of a light unit according to an embodiment.

FIG. 7B is a cross-sectional view illustrating a portion of a light unit according to an embodiment. Specifically, FIG. 7B is a cross-sectional view exemplarily illustrating a region in which one light emitting element 220 (hereinafter, referred to as a light emitting element) is disposed. In describing FIG. 7B, the same component as that described in FIG. 7A will be designated by the same reference symbol, and a description thereof will be omitted.

When FIG. 7B is compared with FIG. 7A, a distance DST between the conductive layer CDL and the wavelength conversion layer WLU is different. The conductive layer CDL may be spaced by the predetermined distance DST from the wavelength conversion layer WLU. Heat generated in the light emitting elements 220 may be dissipated to the outside through the conductive layer CDL.

According to an embodiment, since the wavelength conversion layer WLU is spaced by the predetermined distance DST from the conductive layer CDL, deterioration of the wavelength conversion layer WLU by heat transferred from the conductive layer CDL may be prevented.

Figure 8:
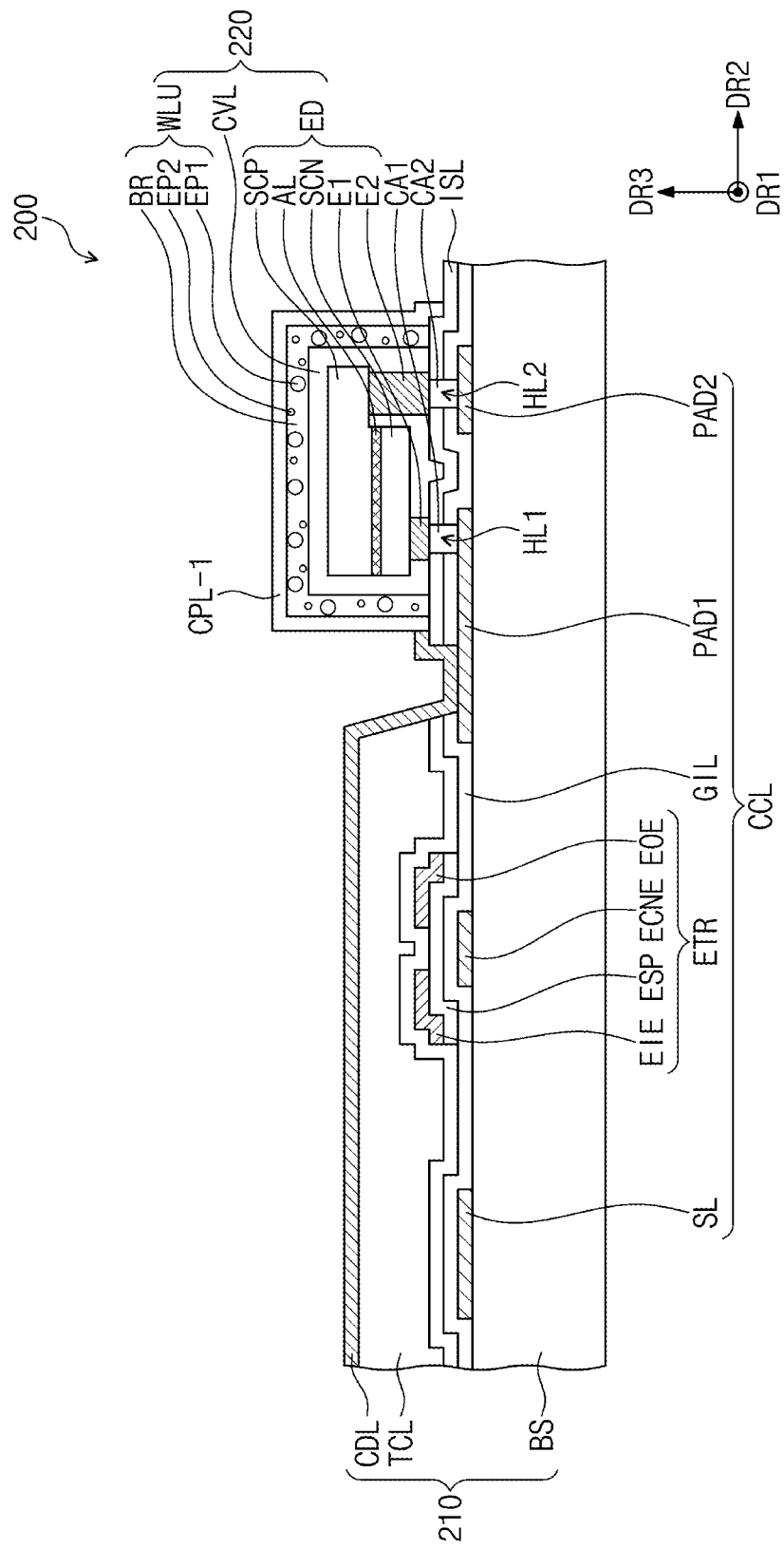
FIG. 8 is a cross-sectional view illustrating a portion of a light unit according to an embodiment.

FIG. 8 is a cross-sectional view illustrating a portion of a light unit according to an embodiment. Specifically, FIG. 8 is a cross-sectional view exemplarily illustrating a region in which one light emitting element 220 (hereinafter, referred to as a light emitting element) is disposed. In describing FIG. 8, the same component as that described in FIG. 7A will be designated by the same reference symbol, and a description thereof will be omitted for descriptive convenience.

When FIG. 8 is compared with FIG. 7A, a capping layer CPL-1 is different. The capping layer CPL-1 may cover the wavelength conversion layer WLU and may not be disposed on the conductive layer CDL. Thus, light incident to the conductive layer CDL may be directly reflected and outputted.

Figure 9:
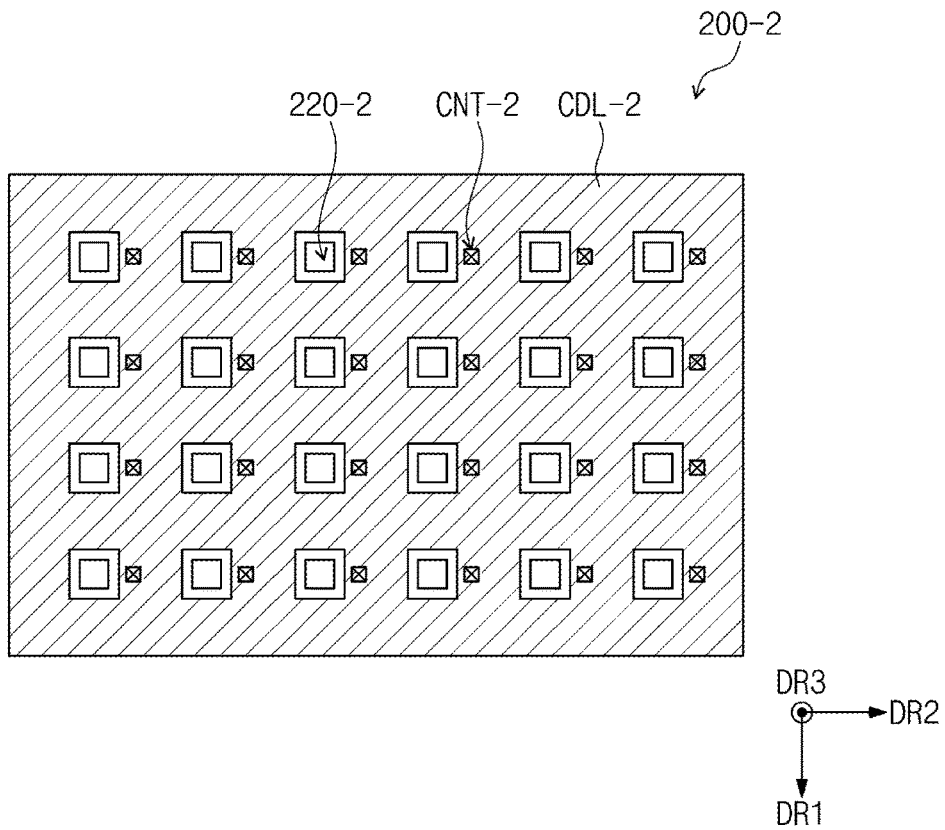
FIG. 9 is a plan view of a light unit according to an embodiment.

FIG. 9 is a plan view of a light unit according to an embodiment.

Referring to FIG. 9, only light emitting elements 220-2 and a conductive layer CDL-2 of the light unit 200-2 are illustrated. Although twenty-four light emitting elements 220-2 are exemplarily illustrated in FIG. 9, embodiments are not limited thereto. The number of the light emitting elements 220-2 may increase as a size of a display panel increases and may be adjusted according to performance of the light emitting elements 220-2.

The light emitting elements 220-2 may not be serially connected to each other. For example, the light emitting elements 220-2 may be connected to each other in parallel. For example, the light emitting elements 220-2 may not be connected to each other.

The conductive layer CDL-2 may be connected to the light emitting elements 220-2. For example, the conductive layer CDL-2 may be connected to electrodes of the light emitting elements 220-2, to which a common voltage is supplied. The common voltage may be the first power voltage or the second power voltage. The conductive layer CDL-2 may be used as a path through which the common voltage is supplied. Thus, a reduction phenomenon of resistance of a line connected to the conductive layer CDL-2 may be exhibited. A voltage drop phenomenon may be compensated by the conductive layer CDL-2.

Referring to FIGS. 5 and 9, the conductive layer CDL-2 may be electrically connected to anode electrodes of the light emitting elements 220-2. The anode electrode may be the second electrode E2 of FIG. 7A. For example, a contact hole CNT-2 may be provided on the second pad PAD2 of FIG. 7A, and the conductive layer CDL-2 may be connected to the second pad PAD2. The first power voltage VDD may be supplied to the conductive layer CDL-2.

Referring to FIGS. 6 and 9, the conductive layer CDL-2 may be electrically connected to cathode electrodes of the light emitting elements 220-2. The cathode electrode may be the first electrode E1 of FIG. 7A. For example, the contact hole CNT-2 may be provided on the first pad PAD1 of FIG. 7A, and the conductive layer CDL-2 may be connected to the first pad PAD1. For example, the second power voltage VSS may be supplied to the conductive layer CDL-2.

Figure 10:
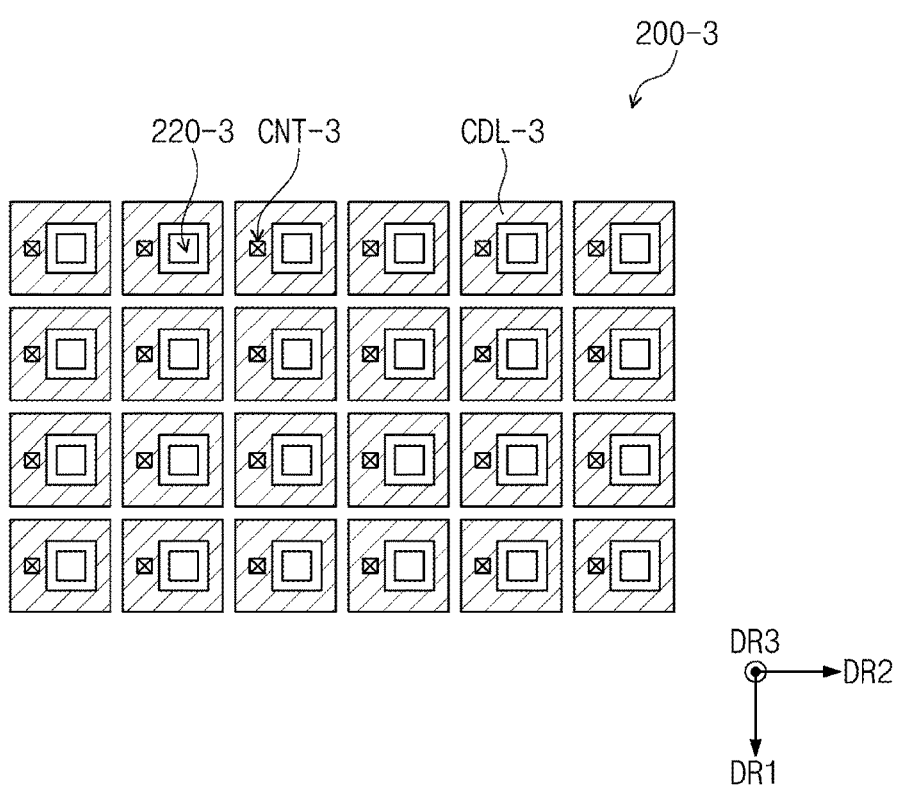
FIG. 10 is a plan view of a light unit according to an embodiment.

FIG. 10 is a plan view of a light unit according to an embodiment.

Referring to FIG. 10, only light emitting elements 220-3 and conductive layers CDL-3 of a light unit 200-3 are illustrated.

The conductive layers CDL-3 may be electrically connected to the light emitting elements 220-3 in a one-to-one corresponding manner. For example, one conductive layer may be connected to one light emitting element.

The conductive layers CDL-3 (hereinafter, referred to as a conductive layer) may be connected to a cathode electrode or an anode electrode of the light emitting elements 220-3 (hereinafter, referred to as a light emitting element). Hereinafter, an example of one conductive layer and one light emitting element will be described.

Referring to FIGS. 5 and 10, the conductive layer CDL-3 may be electrically connected to the cathode electrode or the anode electrode of the light emitting element 220-3. The cathode electrode may be the first electrode E1 of FIG. 7A, and the anode electrode may be the second electrode E2 of FIG. 7A. For example, the contact hole CNT-3 may be disposed on the first pad PAD1 or the second pad PAD2 of FIG. 7A. When the conductive layer CDL-3 is connected to the first pad PAD1, the conductive layer CDL-3 may be disposed between the second transistor TR2$a$ and the light emitting element 220-3. When the conductive layer CDL-3 is connected to the second pad PAD2, the first power voltage VDD may be supplied to the conductive layer CDL-3.

Referring to FIGS. 6 and 10, the conductive layer CDL-3 may be electrically connected to the cathode electrode or the anode electrode of the light emitting element 220-3. The cathode electrode may be the first electrode E1 of FIG. 7A, and the anode electrode may be the second electrode E2 of FIG. 7A. For example, the contact hole CNT-3 may be disposed on the first pad PAD1 or the second pad PAD2 of FIG. 7A. When the conductive layer CDL-3 is connected to the first pad PAD1, the second power voltage VSS may be supplied to the conductive layer CDL-3. When the conductive layer CDL-3 is connected to the second pad PAD2, the conductive layer CDL-3 may be connected between the second transistor TR2$b$ and the light emitting element 220-3.

Figure 11:
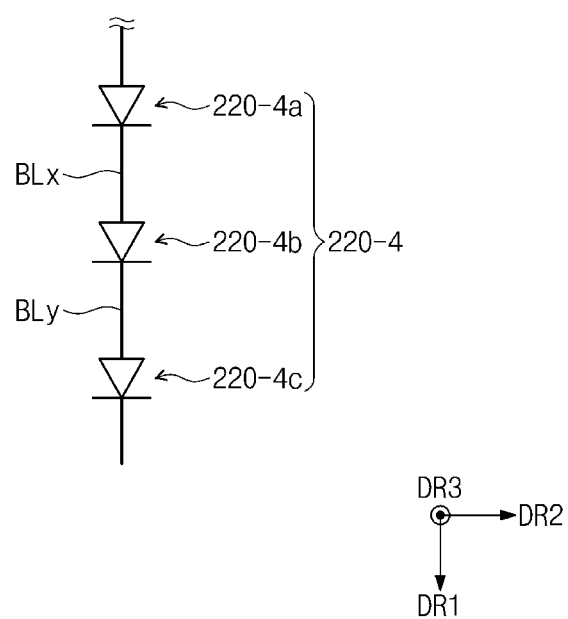
FIG. 11 is an equivalent circuit diagram of light emitting elements according to an embodiment.
Figure 12A:
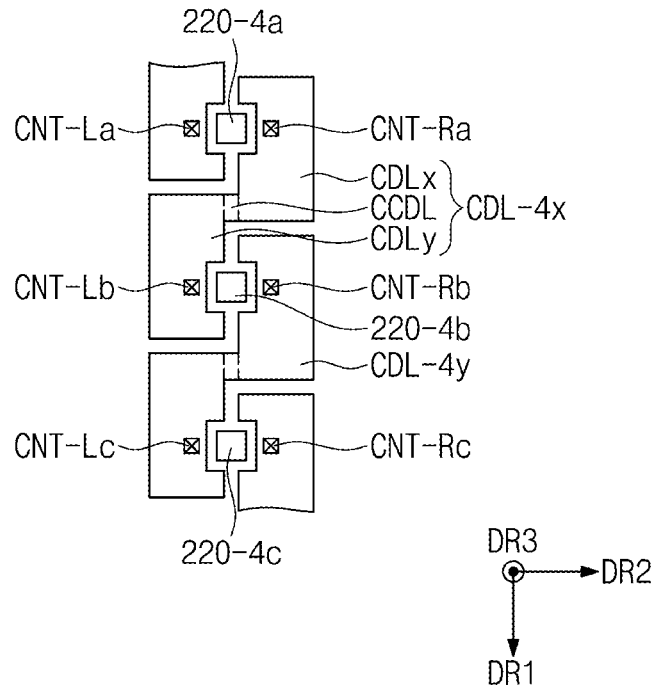
FIG. 12A is a plan view illustrating a partial area of a light unit according to an embodiment.

FIG. 11 is an equivalent circuit diagram of light emitting elements according to an embodiment. FIG. 12A is a plan view illustrating a portion of a light unit according to an embodiment.

Referring to FIGS. 11 and 12A, light emitting elements 220-4 may be serially connected to each other. Although three light emitting elements 220-4 are serially connected to each other as an example in FIG. 11, embodiments are not limited thereto. For example, the light emitting elements 220-4 may include two serially connected light emitting elements or four or more serially connected light emitting elements.

Each of the light emitting element 220$a$ in FIG. 5 and the light emitting element 220$b$ in FIG. 6 may be replaced by the light emitting elements 220-4 in FIG. 11.

The light emitting elements 220-4 may include a first light emitting element 220-4$a$, a second light emitting element 220-4$b$, and a third light emitting element 220-4$c$. The first light emitting element 220-4$a$ may be serially connected to the second light emitting element 220-4$b$, and the second light emitting element 220-4$b$ may be serially connected to the third light emitting element 220-4$c$. The first, second, and third light emitting elements 220-4$a$, 220-4$b$, and 220-4$c$ may be arranged in the first direction DR1.

Contact holes CNT-La, CNT-Lb, and CNT-Lc disposed at left sides of the first, second, and third light emitting elements 220-4$a$, 220-4$b$, and 220-4$c$ may be adjacent to anode electrodes of the first, second, and third light emitting elements 220-4$a$, 220-4$b$, and 220-4$c$. Contact holes CNT-Ra, CNT-Rb, and CNT-Rc disposed at right sides of the first, second, and third light emitting elements 220-4$a$, 220-4$b$, and 220-4$c$ may be adjacent to cathode electrodes of the first, second, and third light emitting elements 220-4$a$, 220-4$b$, and 220-4$c$. For example, the anode electrode may be electrically connected to the second pad PAD2 of FIG. 7A, and the contact holes CNT-La, CNT-Lb, and CNT-Lc may be defined on the second pad PAD2. Also, the cathode electrode may be electrically connected to the first pad PAD1 of FIG. 7A, and the contact holes CNT-Ra, CNT-Rb, and CNT-Rc may be defined on the first pad PAD1.

The first light emitting element 220-4$a$ and the second light emitting element 220-4$b$ may be electrically connected by a first line BLx, and the second light emitting element 220-4$b$ and the third light emitting element 220-4$c$ may be electrically connected by a second line BLy.

Each of conductive layers CDL-4$x$ and CDL-4$y$ may be connected to two light emitting elements. The conductive layers CDL-4$x$ and CDL-4$y$ may include a first conductive layer CDL-4$x$ and a second conductive layer CDL-4$y$. The first conductive layer CDL-4$x$ may be connected to the first light emitting element 220-4$a$ and the second light emitting element 220-4$b$, and the second conductive layer CDL-4$y$ may be connected to the second light emitting element 220-4$b$ and the third light emitting element 220-4$c$. Specifically, the first conductive layer CDL-4$x$ may be connected to the cathode electrode of the first light emitting element 220-4$a$ and the anode electrode of the second light emitting element 220-4$b$, and the second conductive layer CDL-4$y$ may be connected to the cathode electrode of the second light emitting element 220-4$b$ and the anode electrode of the third light emitting element 220-4$c$.

Each of the first conductive layer CDL-4$x$ and the second conductive layer CDL-4$y$ may include a first conductive portion CDLx, a second conductive portion CDLy, and a conductive connection portion CCDL. Since the second conductive layer CDL-4$y$ has the substantially same shape as the first conductive layer CDL-4$x$, the first conductive layer CDL-4$x$ will be described as an example. The first conductive portion CDLx may overlap the contact hole CNT-Ra and be electrically connected to the first light emitting element 220-4$a$. The second conductive portion CDLy may overlap the contact hole CNT-Lb and be electrically connected to the second light emitting element 220-4$b$. Each of the first conductive portion CDLx and the second conductive portion CDLy may extend in the first direction DR1. The conductive connection portion CCDL may be disposed between the first conductive portion CDLx and the second conductive portion CDLy and connect to the first conductive portion CDLx and the second conductive portion CDLy to each other.

According to an embodiment, the first conductive layer CDL-4$x$ may be connected in parallel to the first line BLx, and the second conductive layer CDL-4$y$ may be connected in parallel to the second line BLy. Thus, a line resistance between the first light emitting element 220-4$a$ and the second light emitting element 220-4$b$ and a line resistance between the second light emitting element 220-4$b$ and the third light emitting element 220-4$c$ may be reduced.

Figure 12B:
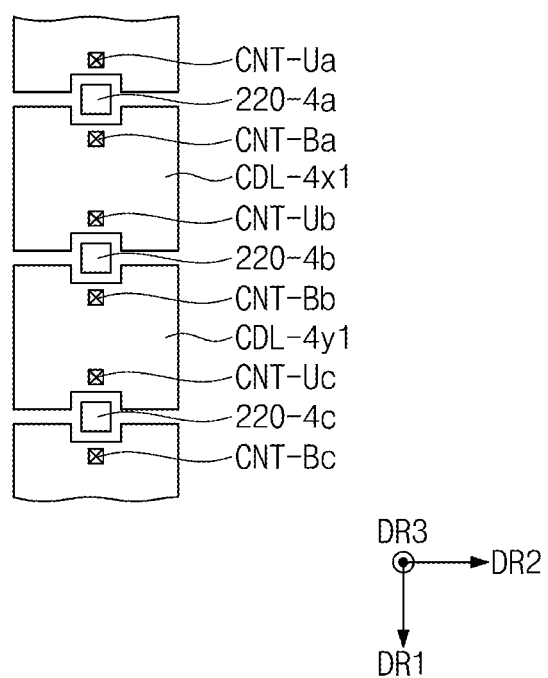
FIG. 12B is a plan view illustrating a partial area of a light unit according to an embodiment.

FIG. 12B is a plan view illustrating a portion of a light unit according to an embodiment. In describing FIG. 12B, the same component as that described in FIG. 12A will be designated by the same reference symbol, and a description thereof will be omitted.

Referring to FIGS. 11 and 12B, contact holes CNT-Ua, CNT-Ub, and CNT-Uc disposed at upper sides of the first, second, and third light emitting elements 220-4$a$, 220-4$b$, and 220-4$c$ may be adjacent to the anode electrodes of the first, second, and third light emitting elements 220-4$a$, 220-4$b$, and 220-4$c$. In a plan view, contact holes CNT-Ba, CNT-Bb, and CNT-Bc disposed at lower sides of the first, second, and third light emitting elements 220-4$a$, 220-4$b$, and 220-4c may be adjacent to the cathode electrodes of the first, second, and third light emitting elements 220-4a, 220-4b, and 220-4c.

Conductive layers CDL-4x1 and CDL-4y1 may include a first conductive layer CDL-4x1 and a second conductive layer CDL-4y1. The first conductive layer CDL-4x1 may be connected to the cathode electrode of the first light emitting element 220-4a and the anode electrode of the second light emitting element 220-4b, and the second conductive layer CDL-4y1 may be connected to the cathode electrode of the second light emitting element 220-4b and the anode electrode of the third light emitting element 220-4c.

Each of the first conductive layer CDL-4x1 and the second conductive layer CDL-4y1 may extend in the first direction DR1. When compared with FIG. 12A, each of the first conductive layer CDL-4x1 and the second conductive layer CDL-4y1 may have a relatively simplified shape. Thus, a manufacturing process of processing the first conductive layer CDL-4x1 and the second conductive layer CDL-4y1 may be further easily performed.

Figure 12C:
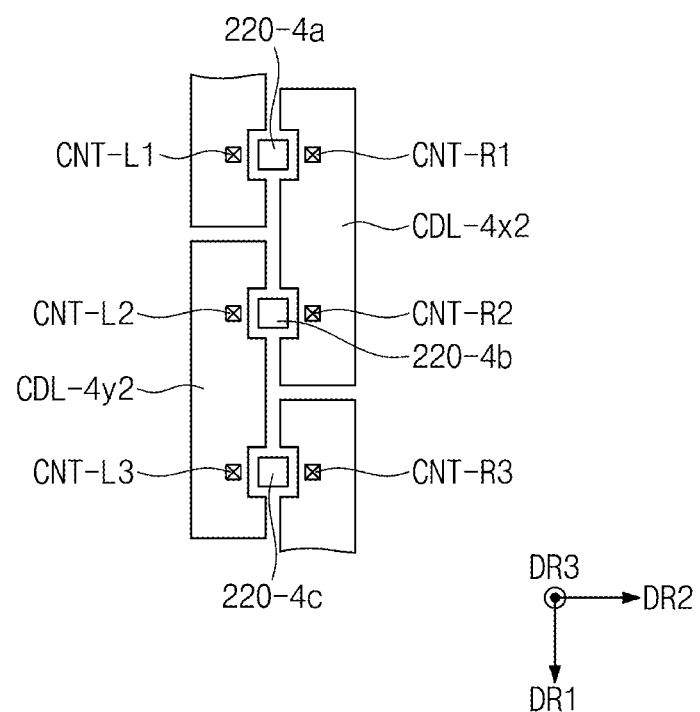
FIG. 12C is a plan view illustrating a partial area of a light unit according to an embodiment.

FIG. 12C is a plan view illustrating a portion of a light unit according to an embodiment. In describing FIG. 12C, the same component as that described in FIG. 12A will be designated by the same reference symbol, and a description thereof will be omitted for descriptive convenience.

Referring to FIGS. 11 and 12C, contact holes CNT-L1 and CNT-L3 disposed at left sides of the first and third light emitting elements 220-4a and 220-4c may be adjacent to the anode electrodes of the first and third light emitting elements 220-4a and 220-4c. In a plan view, a contact hole CNT-L2 disposed at a left side of the second light emitting element 220-4b may be adjacent to the cathode electrode of the second light emitting element 220-4b. In a plan view, contact holes CNT-R1 and CNT-R2 disposed at right sides of the first and third light emitting elements 220-4a and 220-4c may be adjacent to the cathode electrodes of the first and third light emitting elements 220-4a and 220-4c. In a plan view, a contact hole CNT-R2 disposed at a right side of the second light emitting element 220-4b may be adjacent to the anode electrode of the second light emitting element 220-4b.

The conductive layers CDL-4x2 and CDL-4y2 may include a first conductive layer CDL-4x2 and a second conductive layer CDL-4y2. The first conductive layer CDL-4x2 may be connected to the cathode electrode of the first light emitting element 220-4a and the anode electrode of the second light emitting element 220-4b, and the second conductive layer CDL-4y2 may be connected to the cathode electrode of the second light emitting element 220-4b and the anode electrode of the third light emitting element 220-4c.

Each of the first conductive layer CDL-4x2 and the second conductive layer CDL-4y2 may extend in the first direction DR1. When compared with FIG. 12A, each of the first conductive layer CDL-4x2 and the second conductive layer CDL-4y2 may have a relatively simplified shape. Thus, a manufacturing process of processing the first conductive layer CDL-4x2 and the second conductive layer CDL-4y2 may be further easily performed.

Figure 13:
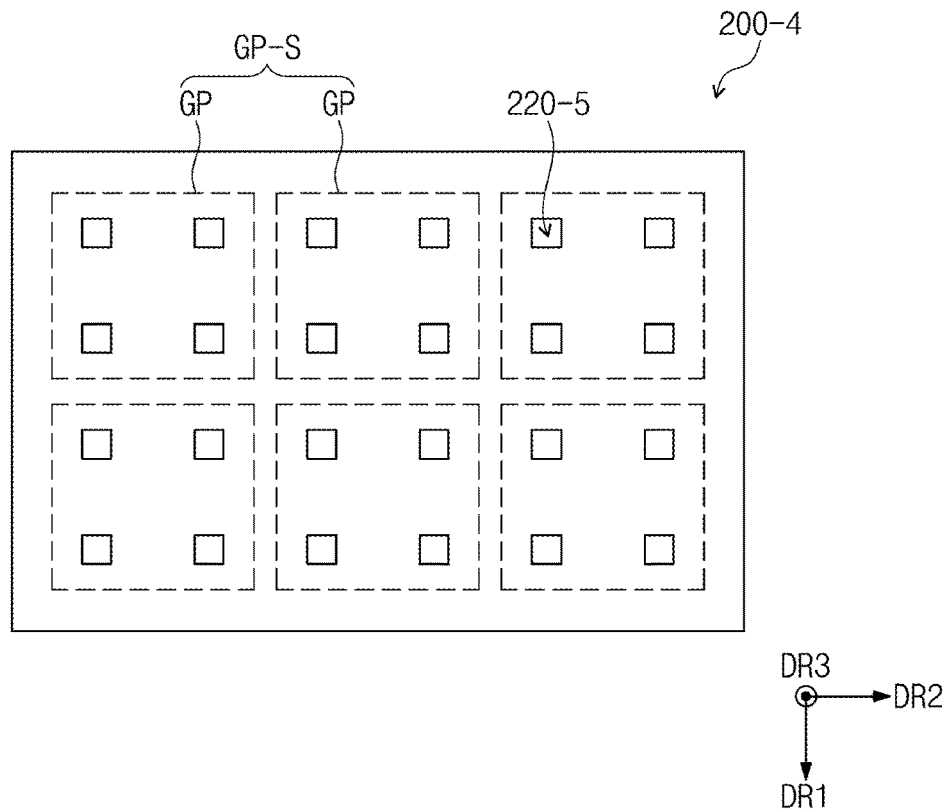
FIG. 13 is a plan view of a light unit according to an embodiment.
Figure 14:
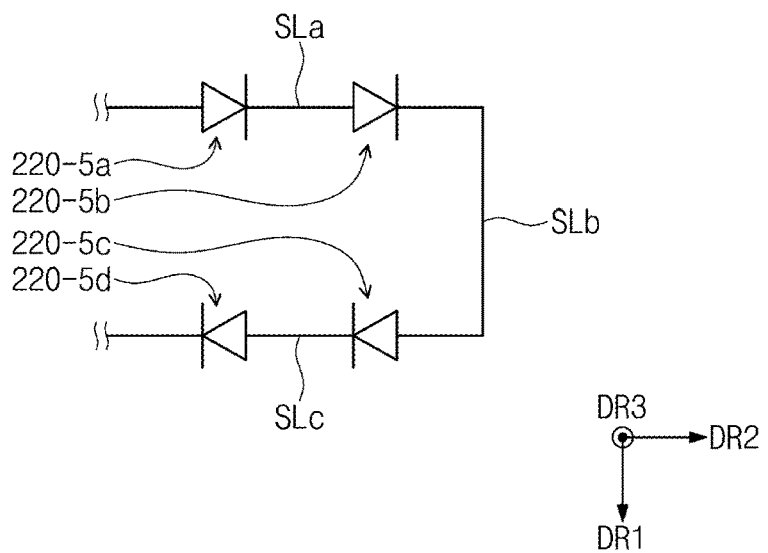
FIG. 14 is an equivalent circuit diagram of light emitting elements according to an embodiment.

FIG. 13 is a plan view of a light unit according to an embodiment. FIG. 14 is an equivalent circuit diagram of light emitting elements according to an embodiment.

Referring to FIGS. 13 and 14, a light unit 200-4 may include light emitting elements 220-5. The light emitting elements 220-5 may be distinguished into groups GP-S. For example, four light emitting elements 220-5 may constitute one group GP. However, this is merely an example, and four or more and four or less light emitting elements 220-5 may constitute one group GP.

Each of the groups GP-S may provide light having different brightness. For example, a case when a first area of the display panel 100 (refer to FIG. 2) provides a high brightness image, and a second area provides a low brightness image will be described as an example. In this case, the light emitting elements contained in a group disposed below the first area may provide light having higher brightness than that of the light emitting elements contained in a group disposed below the second area.

The light emitting elements constituting one group GP may be serially connected to each other. For example, first, second, third, and fourth light emitting elements 220-5a, 220-5b, 220-5c, and 220-5d may be serially connected to each other.

The first light emitting element 220-5a and the second light emitting element 220-5b may be electrically connected by a first line SLa. The second light emitting element 220-5b and the third light emitting element 220-5c may be electrically connected by a second line SLb. The third light emitting element 220-5c and the fourth light emitting element 220-5d may be electrically connected by a third line SLc.

Figure 15A:
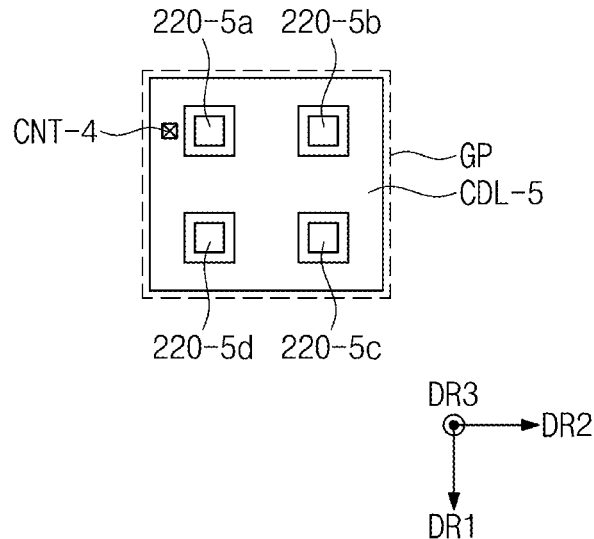
FIG. 15A is a plan view illustrating a partial area of a light unit according to an embodiment.

FIG. 15A is a plan view illustrating a partial area of a light unit according to an embodiment.

Referring to FIGS. 14 and 15A, the second light emitting element 220-5b may be spaced apart from the first light emitting element 220-5a in the second direction DR2, the third light emitting element 220-5c may be spaced apart from the second light emitting element 220-5b in the first direction DR1, and the fourth light emitting element 220-5d may be spaced apart from the first light emitting element 220-5a in the first direction DR1.

The conductive layer CDL-5 may be provided in plurality, and each of the conductive layers may one-to-one correspond to the groups GP-S (refer to FIG. 13). In FIG. 15A, only one conductive layer CDL-5 disposed in one group GP is illustrated.

The conductive layer CDL-5 may be electrically connected to any one of the first, second, third, and fourth light emitting elements 220-5a, 220-5b, 220-5c, and 220-5d. For example, the conductive layer CDL-5 may be connected to the anode electrode of the first light emitting element 220-5a.

The conductive layer CDL-5 may transfer heat generated from the first, second, third, and fourth light emitting elements 220-5a, 220-5b, 220-5c, and 220-5d and dissipate the heat to the outside. Also, the conductive layer CDL-5 may reflect light incident to the conductive layer CDL-5 and provide the reflected light to the display panel 100 (refer to FIG. 2).

Figure 15B:
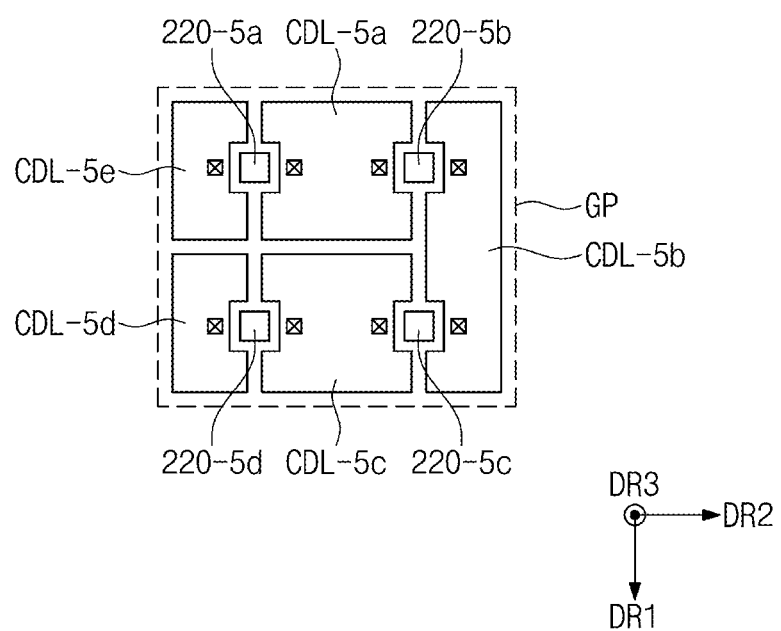
FIG. 15B is a plan view illustrating a partial area of a light unit according to an embodiment.

FIG. 15B is a plan view illustrating a partial area of a light unit according to an embodiment. In describing FIG. 15B, the same component as that described in FIG. 15A will be designated by the same reference symbol, and a description thereof will be omitted for descriptive convenience.

Referring to FIGS. 14 and 15B, a conductive layer may be provided in plurality. A plurality of conductive layers CDL-5a, CDL-5b, CDL-5c, CDL-5d, and CDL-5e may be disposed in one group GP.

A first conductive layer CDL-5a may be connected in parallel to the first line SLa and connected to the cathode electrode of the first light emitting element 220-5a and the anode electrode of the second light emitting element 220-5*b*. The first conductive layer CDL-5*a* may extend in the second direction DR2.

A second conductive layer CDL-5*b* may be connected in parallel to the second line SLb and connected to the cathode electrode of the second light emitting element 220-5*b* and the anode electrode of the third light emitting element 220-5*c*. The second conductive layer CDL-5*b* may extend in the first direction DR1.

A third conductive layer CDL-5*c* may be connected in parallel to the third line SLc and connected to the cathode electrode of the third light emitting element 220-5*c* and the anode electrode of the fourth light emitting element 220-5*d*. The third conductive layer CDL-5*c* may extend in the second direction DR2.

A fourth conductive layer CDL-5*d* may be connected to the cathode electrode of the fourth light emitting element 220-5*d*, and a fifth conductive layer CDL-5*e* may be connected to the anode electrode of the first light emitting element 220-5*a*.

Each of the first, second, third, fourth, and fifth conductive layers CDL-5*a*, CDL-5*b*, CDL-5*c*, CDL-5*d*, and CDL-5*e* is connected to the corresponding first, second, third, and fourth light emitting elements 220-5*a*, 220-5*b*, 220-5*c*, and 220-5*d*. Thus, the first, second, third, fourth, and fifth conductive layers CDL-5*a*, CDL-5*b*, CDL-5*c*, CDL-5*d*, and CDL-5*e* may transfer heat generated from the first, second, third, and fourth light emitting elements 220-5*a*, 220-5*b*, 220-5*c*, and 220-5*d* and dissipate the heat to the outside.

Also, the first, second, third, fourth, and fifth conductive layers CDL-5*a*, CDL-5*b*, CDL-5*c*, CDL-5*d*, and CDL-5*e* may reflect light incident to the first, second, third, fourth, and fifth conductive layers CDL-5*a*, CDL-5*b*, CDL-5*c*, CDL-5*d*, and CDL-5*e* and provide the reflected light to the display panel 100 (refer to FIG. 2).

Also, the first, second, and third conductive layers CDL-5*a*, CDL-5*b*, and CDL-5*c* may be connected in parallel to the first, second, and third lines SLa, SLb, and SLc, respectively, in a one-to-one corresponding manner to reduce resistances between the first, second, third, and fourth light emitting elements 220-5*a*, 220-5*b*, 220-5*c*, and 220-5*d*.

Figure 16:
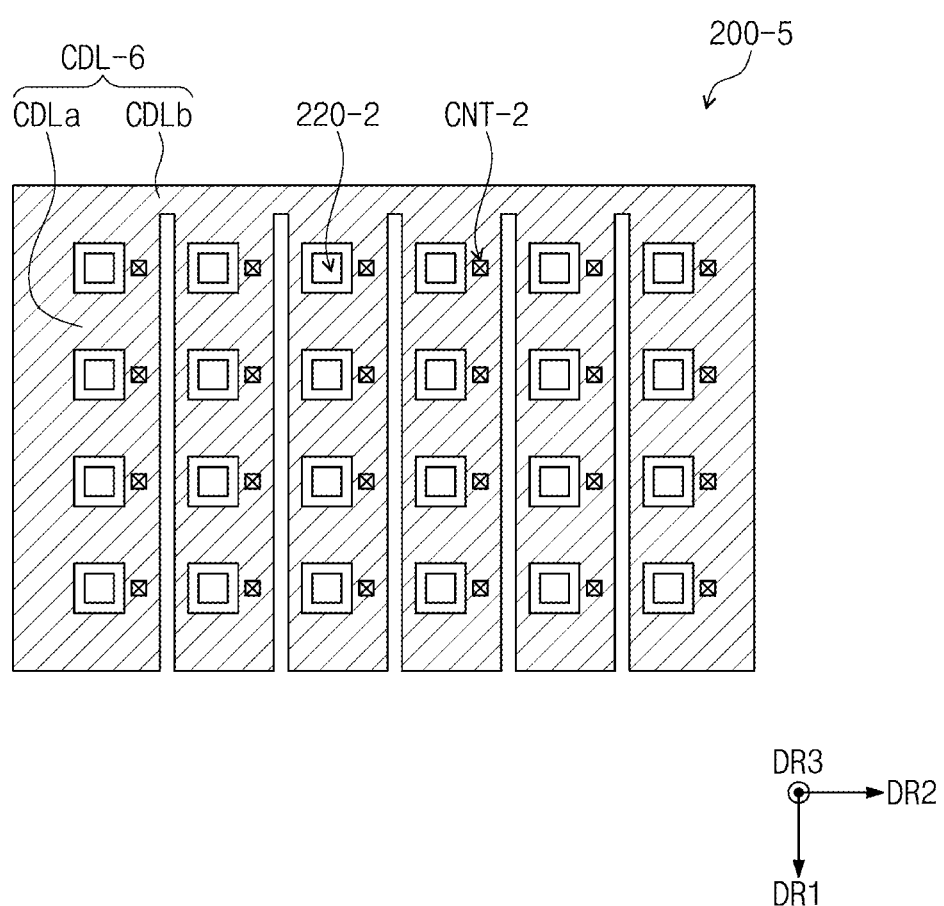
FIG. 16 is a plan view of a light unit according to an embodiment.

FIG. 16 is a plan view of a light unit according to an embodiment. Referring to FIG. 16, the same component as that described in FIG. 9 will be designated by the same reference symbol, and a description thereof will be omitted for descriptive convenience.

Referring to FIG. 16, only conductive layers CDL-6 and light emitting elements 220-2 of a light unit 200-5 are illustrated.

The conductive layer CDL-6 may include a plurality of first partial conductive layers CDLa and a second partial conductive layer CDLb. Each of the first partial conductive layers CDLa may extend in the first direction DR1. The first partial conductive layers CDLa may be spaced apart from each other in the second direction DR2.

The first partial conductive layers CDLa may be connected to the light emitting elements 220-2. In FIG. 16, as an example, four light emitting elements 220-2 are arranged in the first direction DR1.

Each of the first partial conductive layers CDLa may be connected to four light emitting elements 220-2.

Heat generated from the four light emitting elements 220-2 may be dissipated to the outside through one first partial conductive layer CDLa.

The second partial conductive layer CDLb may extend in the second direction DR2. The second partial conductive layer CDLb may be connected to the first partial conductive layers CDLa. In an embodiment, the first partial conductive layers CDLa and the second partial conductive layer CDLb may include the same material as each other and be integrated with each other.

Although the second partial conductive layer CDLb is connected to one end of each of the first partial conductive layers CDLa as an example, embodiments are not limited thereto. For example, the second partial conductive layer CDLb may be connected to the other end of each of the first partial conductive layers CDLa. Also, in another embodiment, the second partial conductive layer CDLb may be provided in plurality, and the plurality of second partial conductive layers CDLb may be connected to the first partial conductive layers CDLa, respectively. The first partial conductive layers CDLa may be disposed between the plurality of second partial conducive layers.

Although each of the first partial conductive layers CDLa is connected to one row of the light emitting elements 220-2 as an example in FIG. 16, each of the first partial conductive layers CDLa may be connected to the light emitting elements 220-2 constituting two or more rows in an embodiment.

Also, in an embodiment, each of the first partial conductive layers CDLa may extend in the second direction DR2, and the first partial conductive layers CDLa may be spaced apart from each other in the first direction DR1. For example, each of the first partial conductive layers CDLa may be connected to six light emitting elements 220-2 arranged in the second direction DR2. In this case, the second partial conductive layer CDLb may extend in the first direction DR1 and be connected to the first partial conductive layers CDLa.

Figure 17:
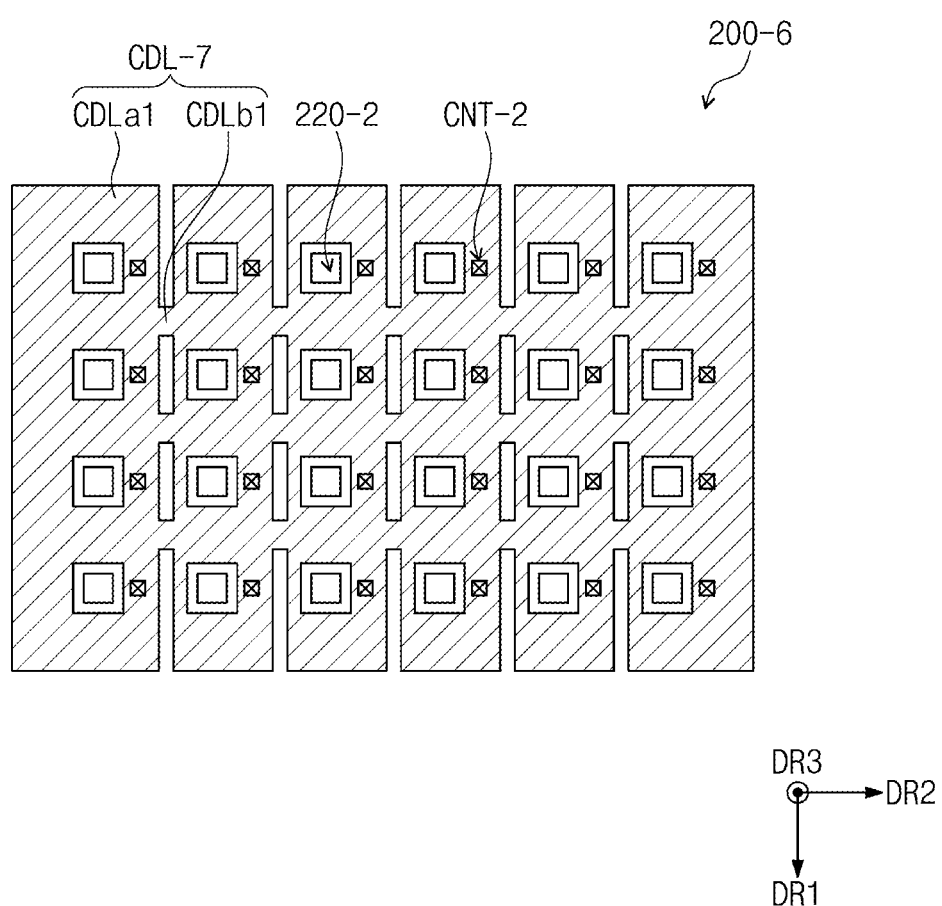
FIG. 17 is a plan view of a light unit according to an embodiment.

FIG. 17 is a plan view of a light unit according to an embodiment. In describing FIG. 17, the same component as that described in FIG. 9 will be designated by the same reference symbol, and a description thereof will be omitted.

Referring to FIG. 17, only conductive layers CDL-7 and light emitting elements 220-2 of a light unit 200-6 are illustrated.

The conductive layer CDL-7 may include a plurality of first partial conductive layers CDLa1 and a plurality of second partial conductive layers CDLb1.

Each of the first partial conductive layers CDLa1 may extend in the first direction DR1. The first partial conductive layers CDLa1 may be spaced apart from each other in the second direction DR2. The second partial conductive layers CDLb1 may connect two adjacent first partial conductive layers CDLa1 to each other. In FIG. 17, the two adjacent first partial conductive layers CDLa1 are connected to each other by three second partial conductive layers CDLb1 as an example. When viewed in the second direction DR2, the second partial conductive layers CDLb1 may not overlap the light emitting elements 220-2. For example, the second partial conductive layers CDLb1 may be connected to areas between the light emitting elements 220-2 of the first partial conductive layers CDLb1.

The first partial conductive layers CDLa1 may be connected to the light emitting elements 220-2. Heat generated from the light emitting elements 220-2 may be dissipated to the outside through the first partial conductive layers CDLa1 and the second partial conductive layers CDLb1.

A light receiving display device includes a display panel for displaying a screen and a backlight unit for providing light to the display panel. The backlight unit may include a light source. The light source may be vulnerable to heat.

Thus, the embodiments providing a method for dissipating the heat generated from the light source has a high industrial applicability.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:

1. A display device comprising:
a display panel; and
a light unit configured to provide light to the display panel,
wherein the light unit comprising:
a substrate;
a circuit layer disposed on the substrate and comprising a line, a transistor and a pad;
an insulation layer configured to cover the circuit layer;
a light emitting element electrically connected to the line and the transistor and comprising a first electrode, a second electrode, and a light emitting layer; and
a conductive layer disposed on the insulation layer and electrically connected to one of the first electrode and the second electrode to cover at least a portion of the line and the transistor,
wherein the conductive layer and the light emitting element are spaced apart on the pad.

2. The display device of claim 1, wherein:
the first electrode is electrically connected to the line, and the second electrode is electrically connected to the transistor.

3. The display device of claim 2, wherein:
the conductive layer is electrically connected to the first electrode and the line, and
each of the conductive layer and the line is configured to receive a power voltage.

4. The display device of claim 2, wherein:
the light emitting element is provided in plurality, and
the conductive layer is electrically connected to the first electrode of each of the light emitting elements.

5. The display device of claim 1, wherein:
each of the light emitting element and the conductive layer is provided in plurality, and
the conductive layers are electrically connected to the light emitting elements, respectively, in a one-to-one corresponding manner.

6. The display device of claim 1, wherein:
the light emitting element is provided in plurality,
the light emitting elements comprise a first light emitting element and a second light emitting element serially connected to the first light emitting element, and
the conductive layer is connected to the first electrode of the first light emitting element and the second electrode of the second light emitting element.

7. The display device of claim 1, wherein the light emitting element further comprises a wavelength conversion layer disposed to cover the light emitting layer.

8. The display device of claim 7, wherein:
the light emitting layer is configured to emit blue light, and
the wavelength conversion layer comprises a first wavelength conversion material and a second wavelength conversion material.

9. The display device of claim 7, wherein the light unit further comprises a capping layer disposed to cover all of the wavelength conversion layer and the conductive layer.

10. The display device of claim 7, wherein the light unit further comprises a capping layer disposed to cover the wavelength conversion layer.

11. The display device of claim 1, wherein:
the light unit further comprises a thickness adjusting layer disposed between the insulation layer and the conductive layer, and
the thickness adjusting layer covers at least a portion of the line and the transistor.

12. The display device of claim 11, wherein the thickness adjusting layer comprises an organic material.

13. The display device of claim 1, further comprising a light guide plate disposed below the display panel,
wherein the light unit faces a side surface of the light guide plate.

14. The display device of claim 1, wherein:
the display panel comprises an active area configured to display an image, and
the light unit is disposed below the active area of the display panel.

15. The display device of claim 1, wherein the conductive layer comprises aluminum.

16. The display device of claim 1, wherein the substrate is a glass substrate.

17. A light unit comprising:
a substrate;
a circuit layer disposed on the substrate and comprising a line and a pad;
an insulation layer configured to cover the circuit layer;
light emitting elements comprising a first electrode, a second electrode, and a light emitting layer; and
a conductive layer disposed on the insulation layer and electrically connected to one of the first electrode and the second electrode through the pad to cover at least a portion of the line,
wherein the conductive layer and at least one of the light emitting elements are spaced apart on the pad.

18. The light unit of claim 17, wherein:
the first electrode is electrically connected to the line, and
the conductive layer is connected to the first electrode of each of the light emitting elements.

19. The light unit of claim 17, wherein:
a first light emitting element and a second light emitting element of the light emitting elements are serially connected to each other, and
the conductive layer is electrically connected to the second electrode of the first light emitting element and the first electrode of the second light emitting element.

20. The light unit of claim 17, wherein:
the conductive layer is provided in plurality, and
the conductive layers are electrically connected to the light emitting elements, respectively, in a one-to-one corresponding manner.

* * * * *